United States Patent
Humphreys et al.

(10) Patent No.: US 7,746,178 B1
(45) Date of Patent: Jun. 29, 2010

(54) DIGITAL OFFSET PHASE-LOCKED LOOP

(75) Inventors: Scott Robert Humphreys, Greensboro, NC (US); Stephen T. Janesch, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 29 days.

(21) Appl. No.: 12/341,528

(22) Filed: Dec. 22, 2008

Related U.S. Application Data

(60) Provisional application No. 61/015,745, filed on Dec. 21, 2007.

(51) Int. Cl.
*H03L 7/06* (2006.01)
*H03L 7/08* (2006.01)

(52) U.S. Cl. .................... 331/1 A; 331/18; 331/25; 331/30

(58) Field of Classification Search ................ 331/1 A, 331/8, 16–18, 25, 30–33; 327/156–159; 332/127; 360/51; 375/376; 455/260
See application file for complete search history.

(56) References Cited

U.S. PATENT DOCUMENTS

2010/0033220 A1* 2/2010 Zhang .................. 327/159

* cited by examiner

*Primary Examiner*—David Mis
(74) *Attorney, Agent, or Firm*—Withrow & Terranova, PLLC

(57) ABSTRACT

The present invention relates to a digital offset phase-locked loop (DOPLL), which may have advantages of size, simplicity, performance, design portability, or any combination thereof, compared to analog-based phase-locked loops (PLLs). The DOPLL may include a digital controlled oscillator (DCO), which provides a controllable frequency output signal based on a digital control signal, a radio frequency (RF) mixer circuit, which provides a reduced-frequency feedback signal based on the controllable frequency output signal without reducing loop gain, a time-to-digital converter (TDC), which provides a digital feedback signal that is a time representation of the reduced-frequency feedback signal, and digital PLL circuitry, which provides the digital control signal based on the digital feedback signal and a digital setpoint signal.

29 Claims, 14 Drawing Sheets

DIGITAL OFFSET PHASE-LOCKED LOOP

This application claims the benefit of provisional patent application Ser. No. 61/015,745, filed Dec. 21, 2007, the disclosure of which is hereby incorporated herein by reference in its entirety.

FIELD OF THE INVENTION

Embodiments of the present invention relate to phase-locked loops, which may be used in frequency synthesizers and may be part of wireless communications systems.

BACKGROUND OF THE INVENTION

Frequency synthesizers are often used when an electrical signal having a variable or controllable frequency is needed. For example, modern wireless communications systems may need to transmit data using different transmit channels having different frequencies. One traditional approach to providing a controllable frequency is a phase-locked loop (PLL).

FIG. 1 shows a traditional PLL 10 according to the prior art. The traditional PLL 10 includes a first voltage controlled oscillator (VCO) 12, a first fractional-N divider 14, a first phase/frequency detector 16, a first charge pump 18, and a first loop filter 20. The first VCO 12, the first fractional-N divider 14, the first phase/frequency detector 16, the first charge pump 18, and the first loop filter 20 forms a control loop having a loop gain and a loop bandwidth. The control loop uses a first reference signal $V_{REF1}$ to synthesize a controlled oscillator output signal $V_{COOUT}$ based on feeding back and frequency reducing the controlled oscillator output signal $V_{COOUT}$ for comparison with the first reference signal $V_{REF1}$.

The first VCO 12 provides the controlled oscillator output signal $V_{COOUT}$, which may be fed to other circuitry needing a controllable frequency signal. Additionally, the controlled oscillator output signal $V_{COOUT}$ is fed to the first fractional-N divider 14, which is one form of frequency reduction circuitry. The first fractional-N divider 14 reduces the frequency of the controlled oscillator output signal $V_{COOUT}$ by using digital divide circuitry to provide a first feedback signal $V_{FB1}$, which has a frequency that is a fraction of the frequency of the controlled oscillator output signal $V_{COOUT}$. Traditional digital dividers typically divide a frequency of an input signal by an integer value. A fractional-N divider may be provided by varying or modulating the integer value to divide the frequency of the input signal by a value that is on average a fractional multiple of an integer.

The first feedback signal $V_{FB1}$ is fed to the first phase/frequency detector 16. Additionally, the first reference signal $V_{REF1}$ is fed to the first phase/frequency detector 16, which compares the first feedback signal $V_{FB1}$ and the first reference signal $V_{REF1}$ to provide a first phase-error signal $V_{PES1}$ based on a phase difference or a frequency difference between the first feedback signal $V_{FB1}$ and the first reference signal $V_{REF1}$. The first phase-error signal $V_{PES1}$ is fed to the first change pump 18, which applies gain to the first phase-error signal $V_{PES1}$ to provide a first charge pump output signal $I_{CPO1}$. The first charge pump output signal $I_{CPO1}$ is fed to the first loop filter 20, which filters the first charge pump output signal $I_{CPO1}$ to provide a first control signal $V_{CS1}$ to the first VCO 12. The frequency of the controlled oscillator output signal $V_{COOUT}$ is based on the first control signal $V_{CS1}$.

As previously discussed, the first VCO 12, the first fractional-N divider 14, the first phase/frequency detector 16, the first charge pump 18, and the first loop filter 20 form a control loop having a loop gain and a loop bandwidth. The loop bandwidth may be determined primarily by a lowpass filter response from the first loop filter 20. The loop gain may be determined primarily by the first charge pump 18, which typically increases the loop gain, and the first fractional-N divider 14, which typically reduces the loop gain. To maintain loop stability, the loop bandwidth may need to be fairly narrow due to the reduction in the loop gain caused by the first fractional-N divider 14.

As wireless devices, such as cell phones, wireless personal digital assistants (PDAs), or the like, evolve and provide expanded feature sets, wireless communications protocols become increasingly complex and demanding in utilization of bandwidth. Sophisticated modulation methods are used to convey as much information as possible while using as little bandwidth as possible. For example, polar modulation methods, which use a combination of phase modulation and amplitude modulation to encode data, are using increasing numbers of constellation points to encode data. Some wireless communications systems phase-modulate PLLs inside the control loop to provide phase-modulated signals. The loop bandwidth of such PLLs must be wide enough to provide accurate phase modulation. However, the high in-band noise of some traditional PLLs may be too high to allow a wide enough loop bandwidth to support the required modulation bandwidth. Therefore, a PLL having a low in-band noise, allowing a wider loop bandwidth than a traditional PLL's loop bandwidth is needed.

FIG. 2 shows a fractional-N offset PLL (FNOPLL) 22 according to the prior art. Both the FNOPLL 22 and the traditional PLL 10 (FIG. 1) include the first VCO 12, the first fractional-N divider 14, the first phase/frequency detector 16, the first charge pump 18, and the first loop filter 20. However, in the FNOPLL 22, the first fractional-N divider 14 is moved outside the control loop and is replaced with a first radio frequency (RF) mixer circuit 24, which includes an RF mixer 26 and a sideband selection filter and buffer 28 in the control loop. A PLL having the RF mixer 26 is called an offset PLL or a translational PLL. The controlled oscillator output signal $V_{COOUT}$ is fed to the RF mixer 26, which is one form of frequency reduction circuitry. The RF mixer 26 mixes the controlled oscillator output signal $V_{COOUT}$ and a local oscillator (LO) output signal $V_{LOOUT}$ to provide an intermediate frequency (IF) signal $V_{IF}$ to the sideband selection filter and buffer 28. The IF signal $V_{IF}$ has two sideband components as a result of mixing the controlled oscillator output signal $V_{COOUT}$ and the LO output signal $V_{LOOUT}$. A frequency of one of the sideband components, called an upper sideband component, is equal to a sum of the frequencies of the controlled oscillator output signal $V_{COOUT}$ and the LO output signal $V_{LOOUT}$. A frequency of the other of the sideband components, called a lower sideband component, is equal to a difference of the frequencies of the controlled oscillator output signal $V_{COOUT}$ and the LO output signal $V_{LOOUT}$.

The sideband selection filter and buffer 28 removes the upper sideband component and provides a filtered IF signal $V_{FIF}$ based on buffering the lower sideband component. A LO 30 provides the LO output signal $V_{LOOUT}$ to the RF mixer 26 and to the first fractional-N divider 14, which reduces the frequency of the LO output signal $V_{LOOUT}$ by using digital divide circuitry to provide a divided LO signal $V_{DLO}$, which has a frequency that is a fraction of the frequency of the LO output signal $V_{LOOUT}$. The filtered IF signal $V_{FIF}$ and the divided LO signal $V_{DLO}$ are fed to the first phase/frequency detector 16, which compares the filtered IF signal $V_{FIF}$ and the divided LO signal $V_{DLO}$ to provide the first phase-error signal $V_{PES1}$ based on a phase difference or a frequency difference between the filtered IF signal $V_{FIF}$ and the divided LO signal $V_{DLO}$. The first phase-error signal $V_{PES1}$ is fed to the first charge pump 18, which applies gain to the first phase-error signal $V_{PES1}$ to provide the first charge pump output signal $I_{CPO1}$. The first charge pump output signal $I_{CPO1}$ is fed to the first loop filter 20, which filters the first charge pump output signal $I_{CPO1}$ to provide the first control signal $V_{CS1}$ to the first VCO 12. The frequency of the controlled oscillator output signal $V_{COOUT}$ is based on the first control signal $V_{CS1}$.

The filtered IF signal $V_{FIF}$ replaces the first feedback signal $V_{FB1}$ (FIG. 1) and the divided LO signal $V_{DLO}$ replaces the first reference signal $V_{REF1}$ (FIG. 1). A frequency of the divided LO signal $V_{DLO}$ is equal to the frequency of the LO output signal $V_{LOOUT}$ divided by an average division ratio associated with the first fractional-N divider 14. Since the average division ratio may be any value, within resolution, tolerance, and operating constraints, an average frequency of the divided LO signal $V_{DLO}$ may be any value. Therefore, the frequency of the controlled oscillator output signal $V_{COOUT}$ may be any value, within resolution, tolerance, and operating constraints.

The first fractional-N divider 14 includes a divider 32, a delta-sigma modulator 34, and a summation circuit 36. The divider 32 receives the LO output signal $V_{LOOUT}$ and provides the divided LO signal $V_{DLO}$ based on dividing the LO output signal $V_{LOOUT}$ using a modulated division integer, which is provided by the summation circuit 36. The summation circuit 36 receives and adds a first fractional integer FFN-N and a modulation integer MN to provide the modulated division integer. The divided LO signal $V_{DLO}$ feeds a clock input CLK of the delta-sigma modulator 34, which receives a first fractional modulation numerator FFN-NUM and uses the divided LO signal $V_{DLO}$ to provide the modulation integer MN based on the first fractional modulation numerator FFN-NUM. The modulation integer MN is an integer that may toggle between two or more values with a duty-cycle. Both the duty-cycle and the integer values are based on the first fractional modulation numerator FFN-NUM and the divided LO signal $V_{DLO}$. By combining the modulation integer MN and the first fractional integer FFN-N, the summation circuit 36 provides the modulated division integer to the divider 32.

Since the modulated division integer is modulated, the divided LO signal $V_{DLO}$ is also modulated, and since the division ratio is equal to the frequency of the LO output signal $V_{LOOUT}$ divided by the frequency of the divided LO signal $V_{DLO}$, the division ratio is also modulated. However, the division ratio may average to any value within resolution and tolerance constraints. Normally, the frequency of modulation of the modulated division integer is greater than the loop bandwidth, such that the frequency of the controlled oscillator output signal $V_{COOUT}$ is about constant when the first fractional modulation numerator FFN-NUM and the first fractional integer FFN-N are constant. Therefore, the frequency of the controlled oscillator output signal $V_{COOUT}$ is based on the average division ratio.

The modulation associated with the first fractional-N divider 14 is generally used to select the average or center frequency associated with the controlled oscillator output signal $V_{COOUT}$; however, additional modulation for communication may be applied to the divider modulus to modulate the controlled oscillator output signal $V_{COOUT}$. Such a modulation must operate within the loop bandwidth to pass undistorted to the controlled oscillator output signal $V_{COOUT}$. The controlled oscillator output signal $V_{COOUT}$ may be phase modulated, frequency modulated, or both, by varying the first fractional modulus numerator FFN-NUM, the first fractional integer FFN-N, or both. Since the loop bandwidth of the traditional PLL 10 (FIG. 1) may be fairly narrow to maintain stability due to the loop gain reduction associated with the first fractional-N divider 14 (FIG. 1), the traditional PLL 10 may be unusable for modulating the controlled oscillator output signal $V_{COOUT}$. However, the RF mixer 26 may not reduce the loop gain significantly; therefore, the loop bandwidth may be fairly wide while maintaining loop stability, such that the loop bandwidth may be wide enough to support modulation requirements of many wireless communications protocols.

FIG. 3 shows details of the LO 30 illustrated in FIG. 2 according to the prior art. The LO 30 is similar to the traditional PLL 10 illustrated in FIG. 1, and includes a second VCO 38, a second fractional-N divider 40, a second phase/frequency detector 42, a second charge pump 44, and a second loop filter 46, and has the LO output signal $V_{LOOUT}$, a second feedback signal $V_{FB2}$, a LO reference signal $V_{LOREF}$, a second phase-error signal $V_{PES2}$, a second charge pump output signal $I_{CPO2}$, and a second control signal $V_{CS2}$, respectively. An LO modulation numerator LO-NUM and a LO integer LO-N may be provided to the second fractional-N divider 40 to select a division ratio of the frequency of the LO output signal $V_{LOOUT}$ divided by the frequency of the second feedback signal $V_{FB2}$.

While the FNOPLL 22 illustrated in FIG. 2 has advantages over the traditional PLL 10 illustrated in FIG. 1, the FNOPLL 22 may have challenges as wireless communications protocols evolve, modulation frequencies increase, and linearity and accuracy requirements increase. For example, at higher offset frequencies of the FNOPLL 22, a well-controlled notch may be required in a transfer function of the first loop filter 20 to suppress the modulated divider noise spectrum in the FNOPLL 22. To precisely control the frequency of the notch, components in the first loop filter 20 may need to be calibrated. Further, additional poles that may be required by the notch in the first loop filter 20 may mandate that a zero in the transfer function of the first loop filter 20 be a very low frequency in order to maintain loop stability. Calibration circuitry and circuitry mandated by the additional poles and a very low frequency zero may add cost, complexity, circuit area, power consumption, or any combination thereof. Additionally, phase detectors and charge pumps operating at higher frequencies may require closer tolerances and may be difficult to design, manufacture, or both. Thus, there is a need for a PLL that is better suited for the challenges presented by evolving wireless communication protocols, providing a low in-band noise allowing a wide loop bandwidth with reasonable cost and complexity.

SUMMARY OF THE EMBODIMENTS

The present invention relates to a digital offset phase-locked loop (DOPLL), which may have advantages of size, simplicity, performance, design portability, or any combination thereof, compared to analog-based phase-locked loops (PLLs). The DOPLL may include a digital controlled oscillator (DCO), which provides a controllable frequency output signal based on a digital control signal, an RF mixer circuit, which provides a reduced-frequency feedback signal based on the controllable frequency output signal without reducing loop gain, a time-to-digital converter (TDC), which provides a digital feedback signal that is a time representation of the reduced-frequency feedback signal, and digital PLL circuitry, which provides the digital control signal based on the digital feedback signal and a digital setpoint signal.

Compared to analog-based PLLs, the DOPLL implements the phase detector and loop filter functions in digital logic as part of the digital PLL circuitry instead of in analog circuitry.

The digital PLL circuitry is typically insensitive to process, temperature, and supply voltage variations unlike the analog-based counterparts. Additionally, the digital PLL circuitry may not require current, resistance, or capacitance calibrations. The digital PLL circuitry enables monitoring, storing, recalling, loading, processing, or any combination thereof, of signals without significant loading effects or noise. Calculations performed by the digital PLL circuitry may be performed with different precision levels, as needed. Reference clock rates may be high, such as hundreds of megahertz, while maintaining linearity. By using digital PLL circuitry, loop filter functionality may be very flexible and programmable. For example, loop bandwidth may be set wide during calibrations and narrow during operation for optimum stability. Alternatively, different loop bandwidths, different loop filter responses, or both, may be used for different operating modes, which may be associated with different wireless communications protocols, different communications bands, or both.

In one embodiment of the present invention, the DOPLL is a dual-loop PLL having a programmable LO provide a reference signal to the RF mixer circuit. Additionally, the programmable LO may provide the reference signal to a TDC. The frequency of the reference signals may be chosen to avoid noise spurs in a wireless communications system, such as RF transmit spurs, spurs that may de-sensitize an RF receiver, or both. By using the RF mixer circuit to provide frequency reduction instead of a fractional-N divider, the absolute time resolution of the TDC may be relaxed significantly, and a loop filter notch associated with the fractional-N divider may be avoided.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
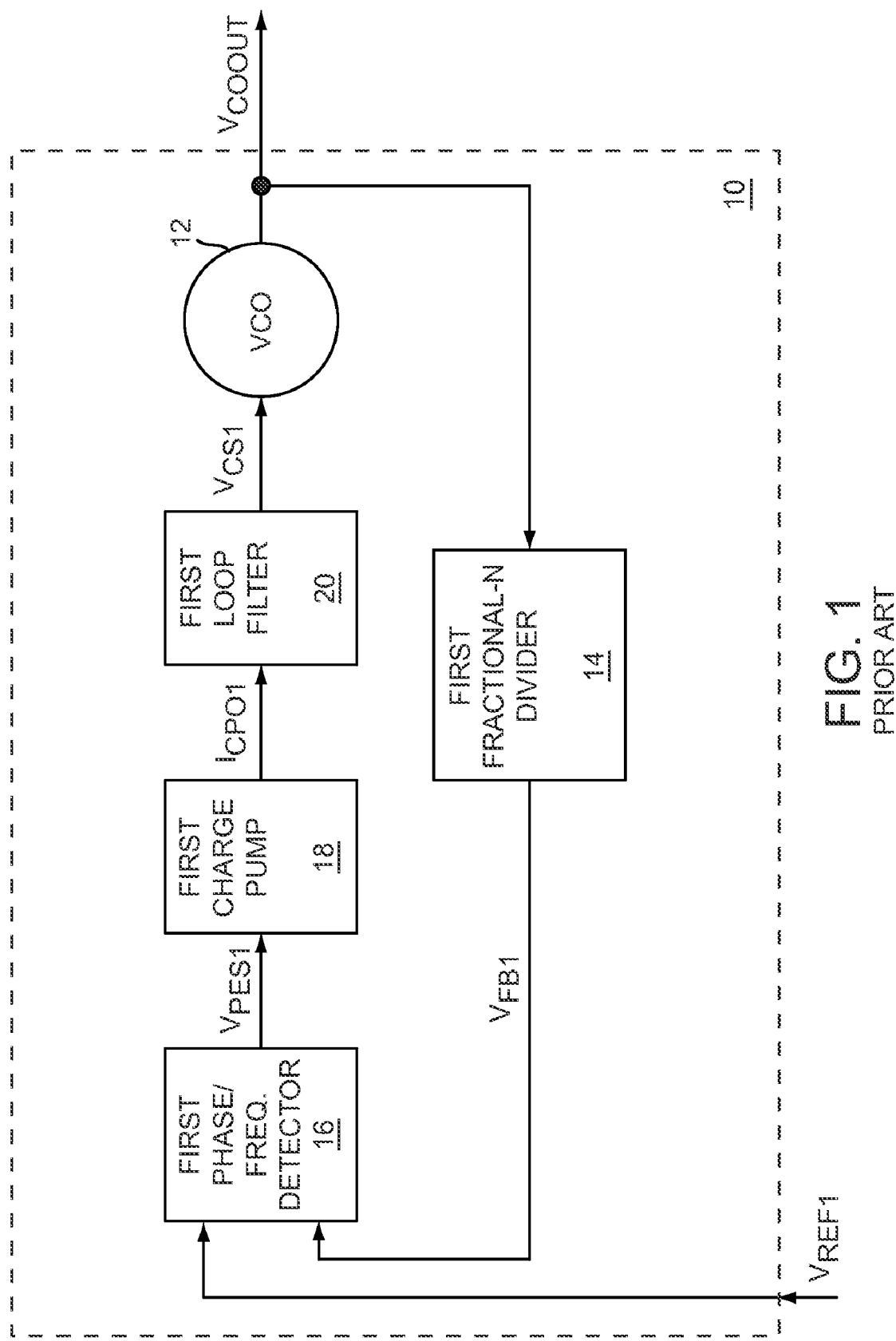
FIG. 1 shows a traditional phase-locked loop (PLL) according to the prior art.
Figure 2:
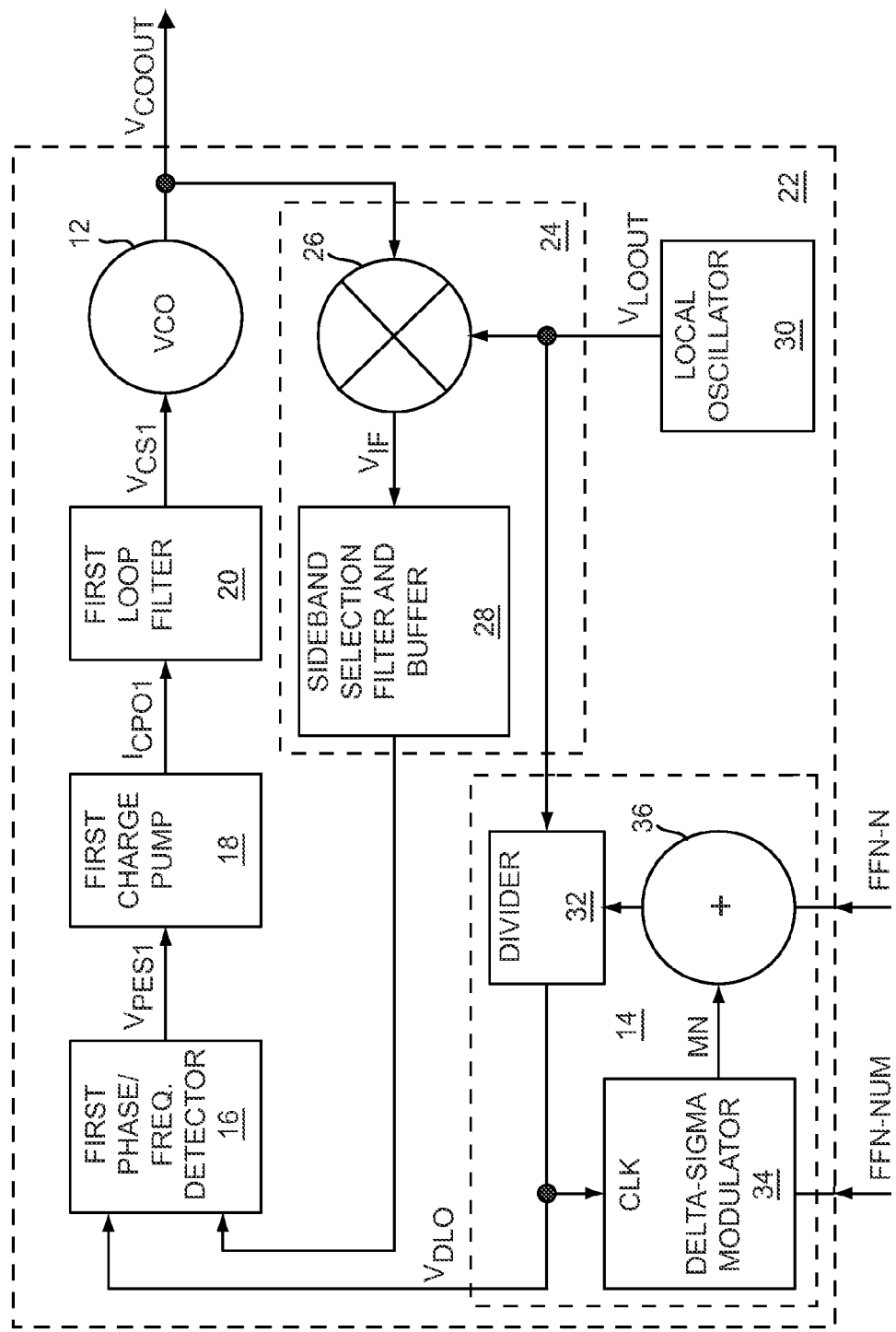
FIG. 2 shows a fractional-N offset PLL (FNOPLL) according to the prior art.
Figure 3:
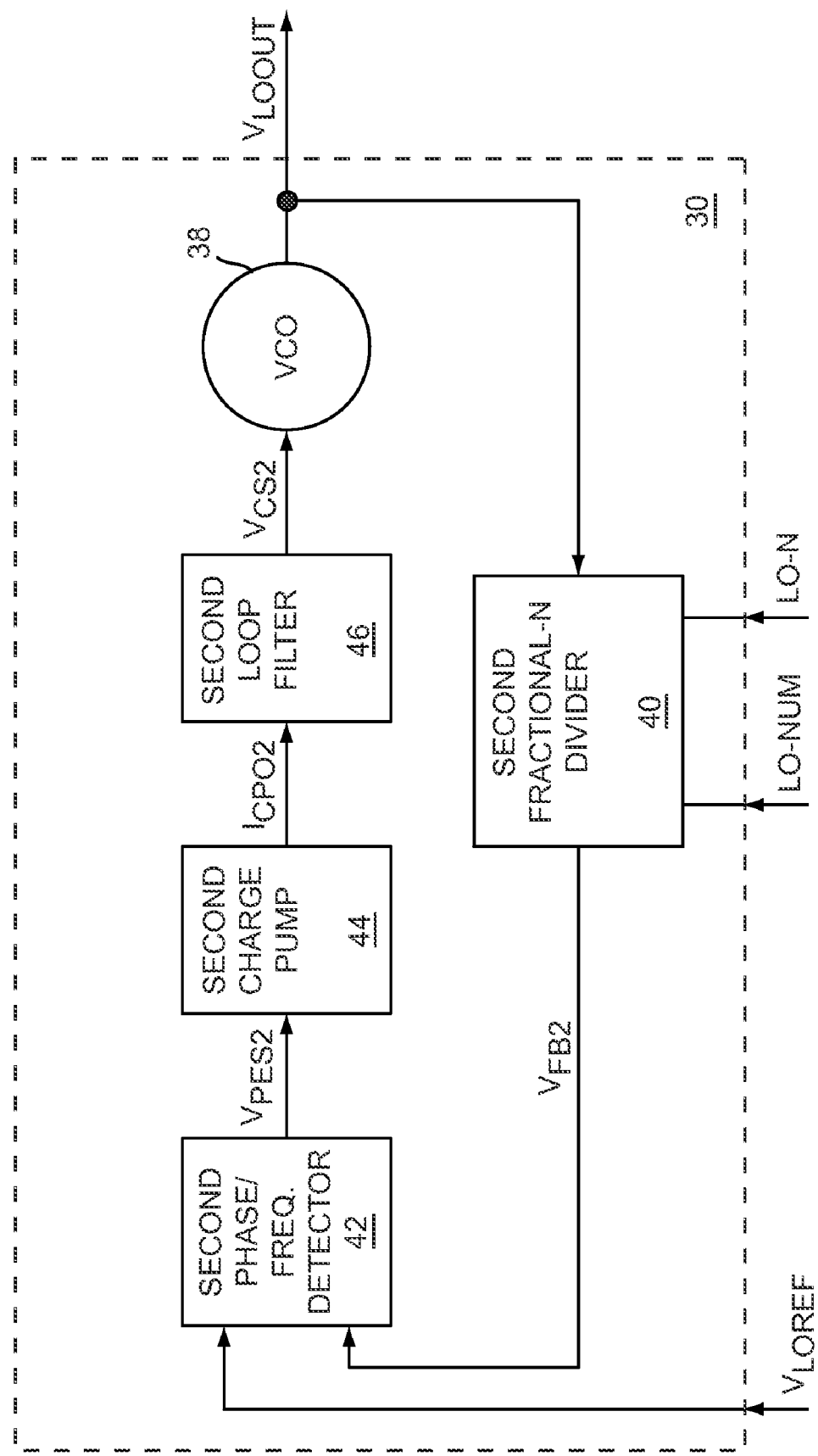
FIG. 3 shows details of a local oscillator (LO) illustrated in FIG. 2 according to the prior art.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a digital offset phase-locked loop (DOPLL), which may have advantages of size, simplicity, performance, design portability, or any combination thereof, compared to analog-based phase-locked loops (PLLs). The DOPLL may include a digital controlled oscillator (DCO), which provides a controllable frequency output signal based on a digital control signal, an RF mixer circuit, which provides a reduced-frequency feedback signal based on the controllable frequency output signal without reducing loop gain, a time-to-digital converter (TDC), which provides a digital feedback signal that is a time representation of the reduced-frequency feedback signal, and digital PLL circuitry, which provides the digital control signal based on the digital feedback signal and a digital setpoint signal.

Compared to analog-based PLLs, the DOPLL implements the phase detector and loop filter functions in digital logic as part of the digital PLL circuitry to provide the phase detector and loop filter functions instead of in analog circuitry. The digital PLL circuitry is typically insensitive to process, temperature, and supply voltage variations unlike the analog-based counterparts. Additionally, the digital PLL circuitry may not require current, resistance, or capacitance calibrations. The digital PLL circuitry enables monitoring, storing, recalling, loading, processing, or any combination thereof, of signals without significant loading effects or noise. Calculations performed by the digital PLL circuitry may be performed with different precision levels, as needed. Reference clock rates may be high, such as hundreds of megahertz, while maintaining linearity. By using digital PLL circuitry, loop filter functionality may be very flexible and programmable. For example, loop bandwidth may be set wide during calibrations and narrow during operation for optimum stability. Alternatively, different loop bandwidths, different loop filter responses, or both, may be used for different operating modes, which may be associated with different wireless communications protocols, different communications bands, or both.

In one embodiment of the present invention, the DOPLL is a dual-loop PLL that has a programmable local oscillator (LO) provide a reference signal to the RF mixer circuit. Additionally, the programmable LO may provide a reference signal to the TDC. The frequency of the reference signals may be chosen to avoid noise spurs in a wireless communications system, such as RF transmit spurs, spurs that may de-sensitize an RF receiver, or both. By using an RF mixer circuit to provide frequency reduction instead of a fractional-N divider, the absolute time resolution of the TDC may be relaxed significantly, and a loop filter notch associated with the fractional-N divider may be avoided.

Figure 4:
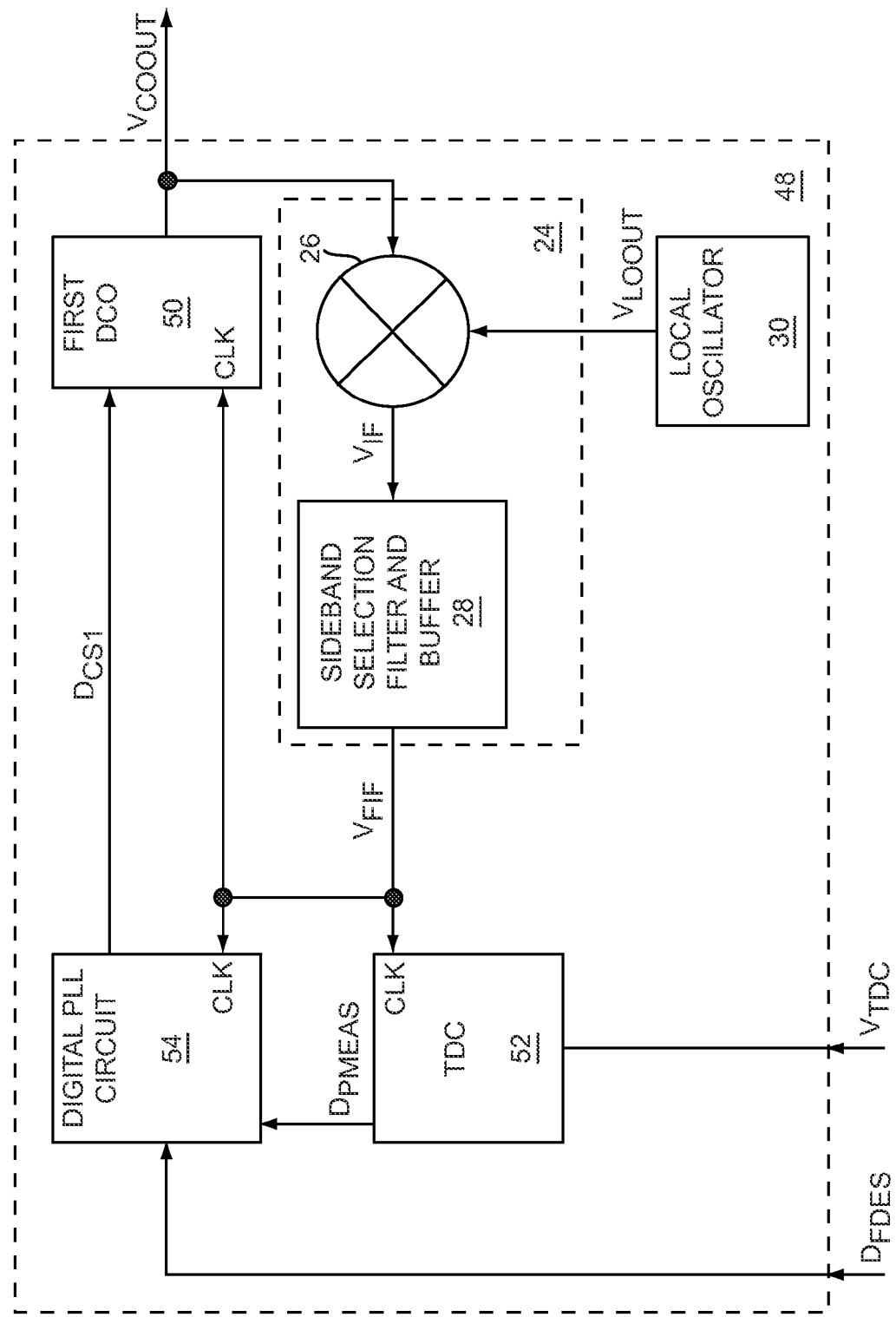
FIG. 4 shows a digital offset PLL (DOPLL) according to one embodiment of the present invention.

FIG. 4 shows a DOPLL 48 according to one embodiment of the present invention. The DOPLL 48 includes the first RF mixer circuit 24, which includes the RF mixer 26 and the sideband selection filter and buffer 28, the LO 30, a first DCO 50, a TDC 52, and a digital PLL circuit 54. A PLL having the RF mixer 26 is called an offset PLL or a translational PLL. The first DCO 50 provides the controlled oscillator output signal $V_{COOUT}$, which has a first output frequency and a first output phase, to the RF mixer 26, which is one form of frequency reduction circuitry. The LO 30 provides the LO output signal $V_{LOOUT}$, which has an LO frequency and an LO phase, to the RF mixer 26, which mixes the controlled oscillator output signal $V_{COOUT}$ and the LO output signal $V_{LOOUT}$ to provide the IF signal $V_{IF}$ to the sideband selection filter and buffer 28. The IF signal $V_{IF}$ has two sideband components as a result of the mixing of the controlled oscillator output signal $V_{COOUT}$ and the LO output signal $V_{LOOUT}$. A frequency of one of the sideband components, which is called an upper sideband component, is equal to a sum of the frequencies of the controlled oscillator output signal $V_{COOUT}$ and the LO output signal $V_{LOOUT}$. A frequency of the other of the sideband components, which is called a lower sideband component, is equal to a difference of the frequencies of the controlled oscillator output signal $V_{COOUT}$ and the LO output signal $V_{LOOUT}$. The sideband selection filter and buffer 28 removes the upper sideband component and provides the filtered IF signal $V_{FIF}$ based on buffering the lower sideband component.

The filtered IF signal $V_{FIF}$ has a first IF frequency and a first IF phase. The first IF frequency is based on a difference between the first output frequency and the LO frequency and the first IF phase is based on a difference between the first output phase and the LO phase. The filtered IF signal $V_{FIF}$ is fed to a clock input CLK of the TDC 52, which receives a TDC reference signal $V_{TDC}$ and provides a digital phase measurement signal $D_{PMEAS}$ to the digital PLL circuit 54 based on the filtered IF signal $V_{FIF}$ and the TDC reference signal $V_{TDC}$. The TDC 52 converts the filtered IF signal $V_{FIF}$ into a digital time representation of the filtered IF signal $V_{FIF}$ by sampling the TDC reference signal $V_{TDC}$ using the filtered IF signal $V_{FIF}$ as a sampling clock. The filtered IF signal $V_{FIF}$ is continuous time valued, whereas the digital phase measurement signal $D_{PMEAS}$ is discrete time valued and is based on the digital time representation of the filtered IF signal $V_{FIF}$. By sampling the TDC reference signal $V_{TDC}$ using the filtered IF signal $V_{FIF}$ as a sampling clock, the TDC 52 creates a time, phase, or frequency measurement of the IF signal, which is sampled (or updated) at a rate equal to the first IF frequency. The time reference needs enough precision to provide acceptable TDC quantization noise and sufficient range to prevent the DOPLL 48 from locking to an alias or harmonic of the first IF frequency. Since the first IF frequency is based on the first output frequency and since the digital phase measurement signal $D_{PMEAS}$ is a digital time representation of the filtered IF signal $V_{FIF}$, the digital phase measurement signal $D_{PMEAS}$ is indicative of the first output frequency. Similarly, since the first IF phase is based on the first output phase and since the digital phase measurement signal $D_{PMEAS}$ is a digital time representation of the filtered IF signal $V_{FIF}$, the digital phase measurement signal $D_{PMEAS}$ is indicative of the first output phase. One skilled in the art will recognize that phase is related to frequency through integral or summation operations, and frequency is related to phase through differentiation or difference operations. In one embodiment of the present invention, the updates to the digital phase measurement signal $D_{PMEAS}$ are synchronized to the filtered IF signal $V_{FIF}$. Additionally, the digital phase measurement signal $D_{PMEAS}$ may include any number of bits.

The digital PLL circuit 54 receives a digital desired frequency signal $D_{FDES}$, which may function as a digital setpoint signal. The digital PLL circuit 54 provides a first digital control signal $D_{CS1}$ to the first DCO 50, such that the first output frequency and the first output phase are based on the first digital control signal $D_{CS1}$. The first digital control signal $D_{CS1}$ is based on a difference associated with the digital phase measurement signal $D_{PMEAS}$ and the digital desired frequency signal $D_{FDES}$. Therefore, the first output frequency, the first output phase, or both are based on the digital desired frequency signal $D_{FDES}$. Specifically, the digital desired frequency signal $D_{FDES}$ may include a first reference frequency, a first reference phase, or both, and the first output phase may be based on a difference between the first output phase and the first reference phase, the first output frequency may be based on an association between the first output frequency and the first reference frequency, or both. The digital desired frequency signal $D_{FDES}$ may include any number of bits. Additionally, the first digital control signal $D_{CS1}$ may include any number of bits. In one embodiment of the present invention, the filtered IF signal $V_{FIF}$ is fed to a clock input CLK of the digital PLL circuit 54, to a clock input CLK of the first DCO 50, or both. The filtered IF signal $V_{FIF}$ may be used as a sampling clock to synchronize to the digital phase measurement signal $D_{PMEAS}$, to the first digital control signal $D_{CS1}$, to the digital desired frequency signal $D_{FDES}$, or any combination thereof.

In one embodiment of the present invention, the DOPLL 48 is a single loop PLL, which is formed by using the RF mixer circuit 24, the first DCO 50, the TDC 52, and the digital PLL circuit 54. The LO 30 is not a PLL; however, the LO 30 may provide a fixed frequency LO output signal $V_{LOOUT}$ or a variable frequency LO output signal $V_{LOOUT}$. In an alternate embodiment of the present invention, the DOPLL 48 is a dual loop PLL, such that the first PLL loop is formed using the RF mixer circuit 24, the first DCO 50, the TDC 52, and the digital PLL circuit 54, and the LO 30 provides a second PLL loop.

In one embodiment of the present invention, an RF transmit signal may be based on the controlled oscillator output signal $V_{COOUT}$. The LO frequency may be chosen to avoid at least one RF transmit spur. The RF mixer circuit 24, the first DCO 50, the TDC 52, and the digital PLL circuit 54 may form a PLL having a PLL loop bandwidth. The digital desired frequency signal $D_{FDES}$ may be modulated to frequency modulate the controlled oscillator output signal $V_{COOUT}$, which may have a frequency modulation bandwidth. The frequency modulation bandwidth may be less than the PLL loop bandwidth. The digital desired frequency signal $D_{FDES}$ may be modulated to phase modulate the controlled oscillator output signal $V_{COOUT}$, which may have a phase modulation bandwidth. The phase modulation bandwidth may be less than the PLL loop bandwidth. The digital desired frequency signal $D_{FDES}$ may be modulated to phase modulate and frequency modulate the controlled oscillator output signal $V_{COOUT}$, which may have a phase modulation bandwidth and a frequency modulation bandwidth. The phase modulation bandwidth, the frequency modulation bandwidth, or both, may be less than the PLL loop bandwidth. One skilled in the art will recognize that predistortion techniques may be used to compensate for distortion introduced by the PLL bandwidth being narrower than the modulation bandwidth, such as the method disclosed by Michael H. Perrott in U.S. Pat. No. 6,008,703. It will be appreciated further that the use of a digital filter allows more precise alignment of a predistortion filter to the PLL transfer function than is possible with an analog filter.

Figure 5:
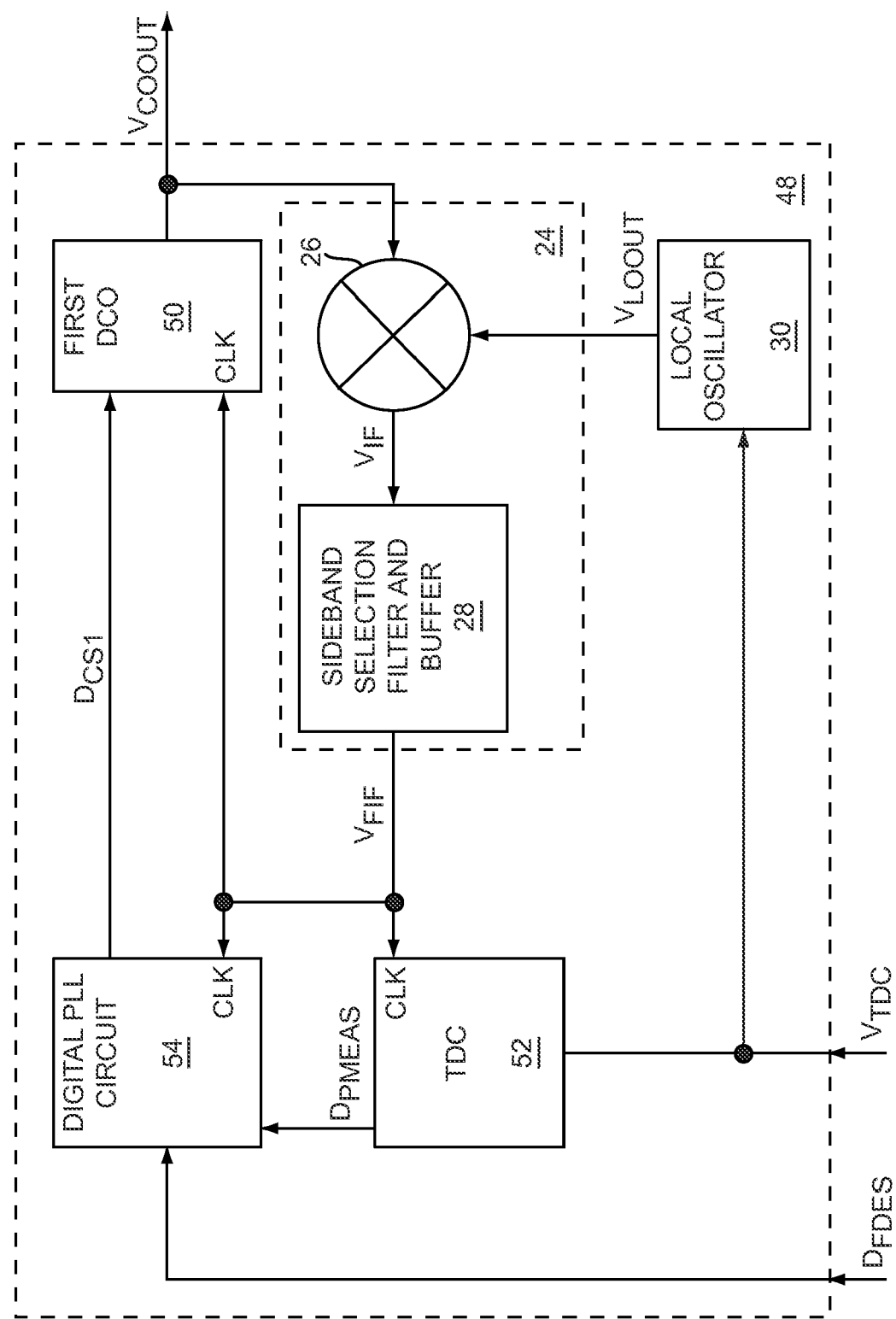
FIG. 5 shows the DOPLL according to an alternate embodiment of the present invention.

FIG. 5 shows the DOPLL 48 according to an alternate embodiment of the present invention. The DOPLL 48 illustrated in FIG. 5 is similar to the DOPLL 48 illustrated in FIG. 4, except the TDC 52 and the LO 30 illustrated in FIG. 5 receive and use the TDC reference signal $V_{TDC}$ as a common reference signal. The LO 30 uses the TDC reference signal $V_{TDC}$ to synthesize and provide the LO output signal $V_{LOOUT}$.

Figure 6:
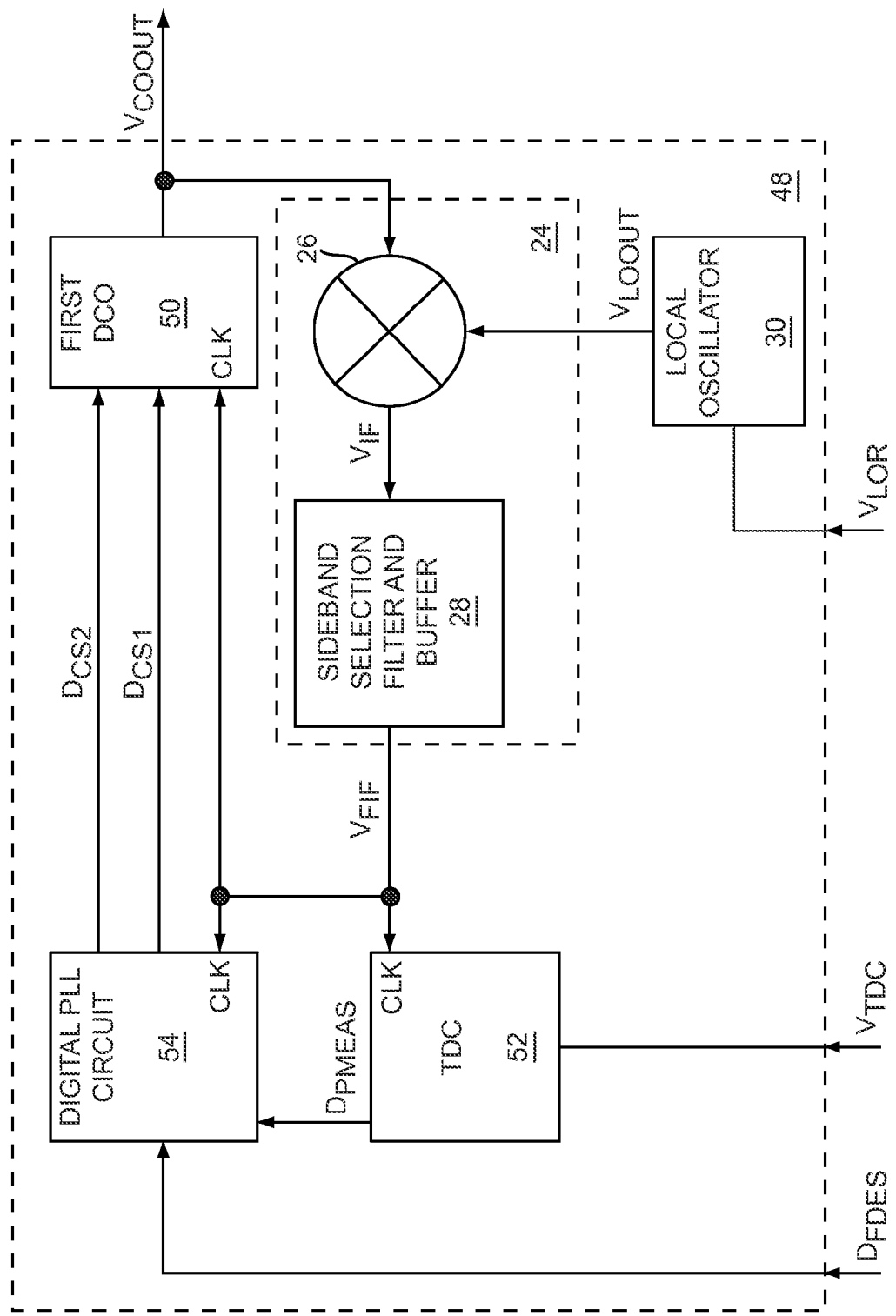
FIG. 6 shows the DOPLL according to another embodiment of the present invention.

FIG. 6 shows the DOPLL 48 according to another embodiment of the present invention. The DOPLL 48 illustrated in FIG. 6 is similar to the DOPLL 48 illustrated in FIG. 4, except the LO 30 illustrated in FIG. 6 receives and may use a LO reference signal $V_{LOR}$ to synthesize and provide the LO output signal $V_{LOOUT}$. Additionally, the digital PLL circuit 54 may provide a second digital control signal $D_{CS2}$ to the first DCO 50, such that the first output frequency and the first output phase are based on both the first digital control signal $D_{CS1}$ and the second digital control signal $D_{CS2}$. Both the first digital control signal $D_{CS1}$ and the second digital control signal $D_{CS2}$ may be based on a difference between the digital phase measurement signal $D_{PMEAS}$ and the digital desired frequency signal $D_{FDES}$. In some embodiments of the present invention, intermediate processing may be applied to the digital phase measurement signal $D_{PMEAS}$, the digital desired frequency signal $D_{FDES}$, or both, prior to taking the difference between the signals. Such intermediate processing may include integration, differentiation, or both. The second digital control signal $D_{CS2}$ may include any number of bits. Further, the first and second digital control signals $D_{CS1}$, $D_{CS2}$ may be combined to provide a single digital control signal. The second digital control signal $D_{CS2}$ may include bits of a higher significance than bits associated with the first digital control signal $D_{CS1}$.

Figure 7:
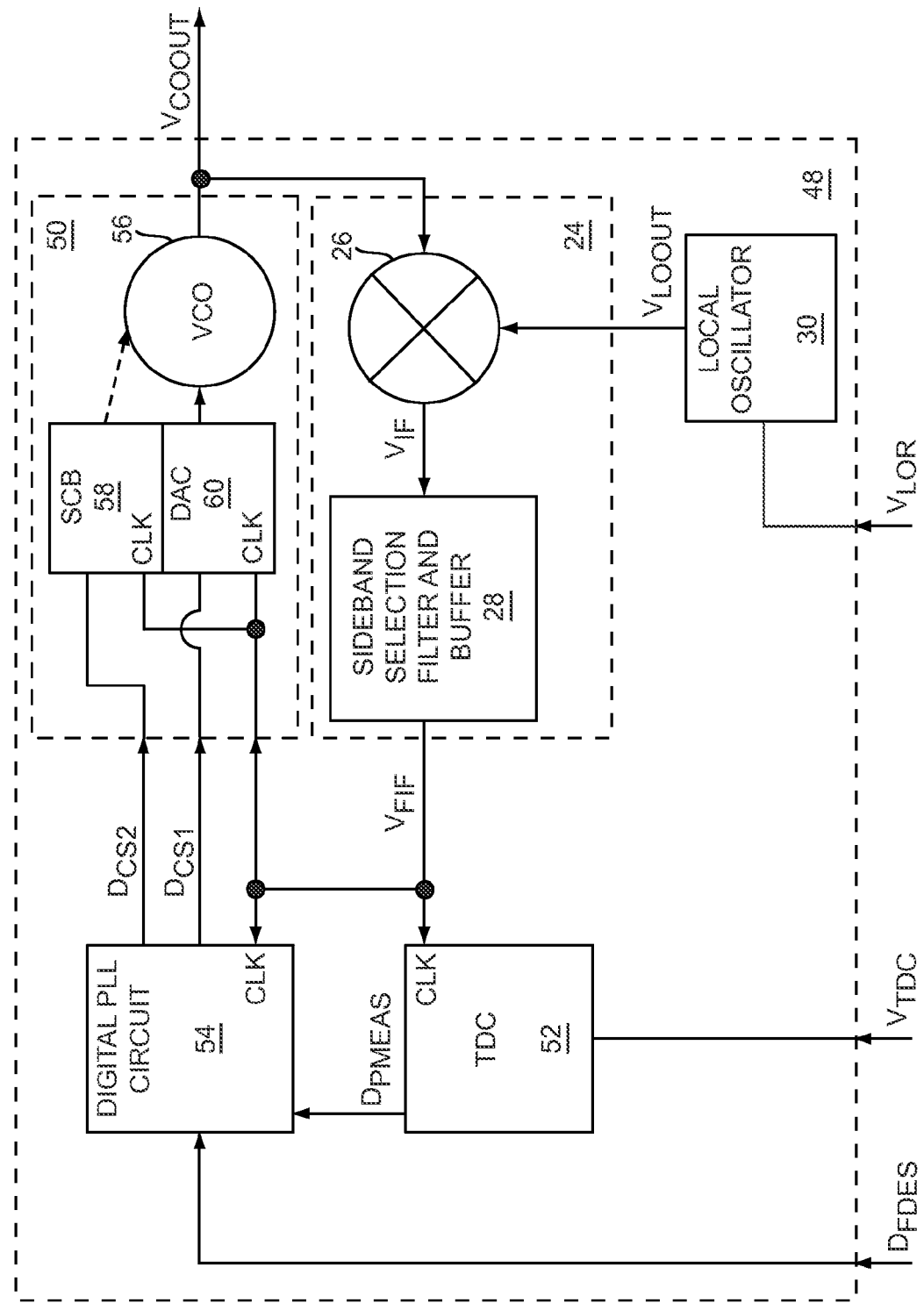
FIG. 7 shows details of a first digital controlled oscillator (DCO) illustrated in FIG. 6.

FIG. 7 shows details of the first DCO 50 illustrated in FIG. 6 according to one embodiment of the present invention. The first DCO 50 includes a voltage controlled oscillator (VCO) 56, a switched capacitor bank (SCB) 58, and a digital-to-analog converter (DAC) 60. Alternate embodiments of the present invention may omit either the SCB 58 or the DAC 60. The VCO 56 provides the controlled oscillator output signal $V_{COOUT}$, such that the first output frequency, the first output phase, or both, are based on an analog signal received from the DAC 60, on one or more capacitors selected in the SCB 58, or both. A voltage bias on a varactor diode (not shown) in the VCO 56 may control a varactor capacitance of the VCO 56. The varactor capacitance, the capacitance associated with capacitor selection in the SCB 58, or both, may interact with other resonant elements in the VCO 56, such that the first output frequency, the first output phase, or both, are based on the varactor capacitance, the capacitor selection, or both. The DAC 60 receives the first digital control signal $D_{CS1}$ and may provide the analog signal based on the first digital control signal $D_{CS1}$. The SCB 58 receives the second digital control signal $D_{CS2}$ and may select the one or more capacitors based on the second digital control signal $D_{CS2}$. In one embodiment of the present invention, the filtered IF signal $V_{FIF}$ is fed to a clock input CLK of the SCB 58, to a clock input CLK of the DAC 60, or both. The filtered IF signal $V_{FIF}$ may be used as a sampling clock to synchronize to the first digital control signal $D_{CS1}$, to the second digital control signal $D_{CS2}$, or both.

In an alternate embodiment of the present invention, the second digital control signal $D_{CS2}$ and the SCB 58 are omitted, such that the first output frequency, the first output phase, or both, are based on the varactor capacitance. In another embodiment of the present invention, the second digital control signal $D_{CS2}$ is omitted and replaced with the first digital control signal $D_{CS1}$. Additionally, the DAC 60 is omitted, such that the first output frequency, the first output phase, or both, are based on the capacitor selection.

Figure 8:
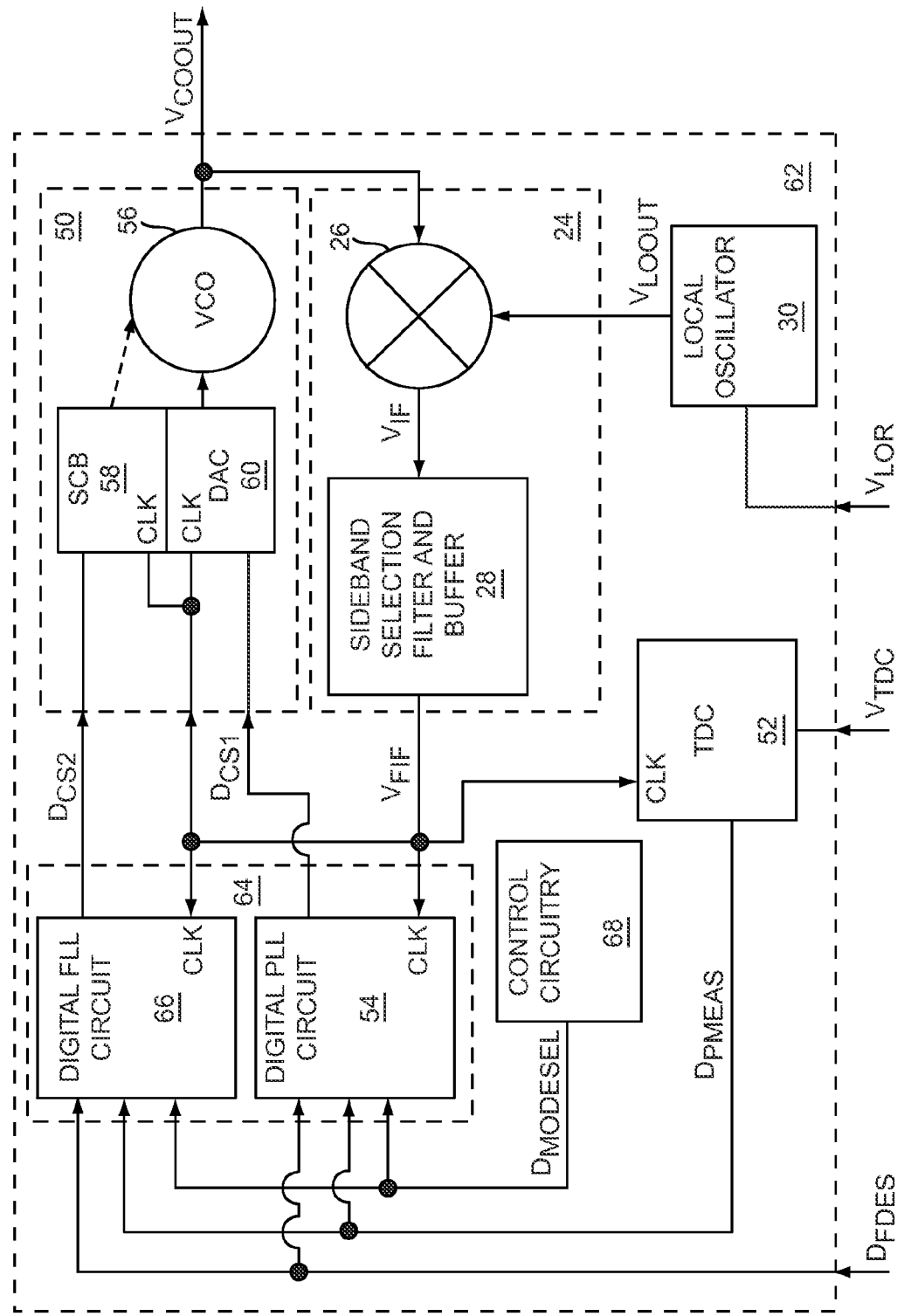
FIG. 8 shows a combined frequency-locked loop (FLL) and PLL according to an additional embodiment of the present invention.

FIG. 8 shows a combined frequency-locked loop (FLL) and PLL 62 according to an additional embodiment of the present invention. The combined FLL and PLL 62 includes digital loop circuitry 64, which includes the digital PLL circuit 54 and a digital FLL circuit 66, and control circuitry 68. Additionally, the combined FLL and PLL 62 includes the first DCO 50, the first RF mixer circuit 24, the LO 30, and the TDC 52. Any or all of the first DCO 50, the first RF mixer circuit 24, the LO 30, and the TDC 52 may operate similarly to the first DCO 50, the first RF mixer circuit 24, the LO 30, and the TDC 52, respectively, illustrated in FIG. 7. The control circuitry 68 may select either a coarse tuning mode or a fine tuning mode. Additionally, the control circuitry 68 provides a mode select signal $D_{MODESEL}$ to the digital PLL circuit 54 and to the digital FLL circuit 66 to indicate which mode is selected. The TDC 52 may provide the digital phase measurement signal $D_{PMEAS}$ to the digital PLL circuit 54 and to the digital FLL circuit 66. Both the digital PLL circuit 54 and the digital FLL circuit 66 may receive the digital desired frequency signal $D_{FDES}$. The digital PLL circuit 54 provides the first digital control signal $D_{CS1}$ and the digital FLL circuit 66 provides the second digital control signal $D_{CS2}$. The filtered IF signal $V_{FIF}$ may be fed to a clock input CLK of the digital FLL circuit 66 and used as a sampling clock to synchronize to the digital phase measurement signal $D_{PMEAS}$, to the second digital control signal $D_{CS2}$, to the digital desired frequency signal $D_{FDES}$, or any combination thereof. In an alternate embodiment of the present invention, the TDC reference signal $V_{TDC}$ may be fed to the clock input CLK of the digital FLL circuit 66, to the clock input CLK of the digital PLL circuit 54, to the clock input CLK of the SCB 58, to the clock input CLK of the DAC 60, or any combination thereof, in place of the filtered IF signal $V_{FIF}$.

During the coarse tuning mode, the digital FLL circuit 66 may control the first output frequency by varying the second digital control signal $D_{CS2}$ based on a frequency difference associated with the digital phase measurement signal $D_{PMEAS}$ and the digital desired frequency signal $D_{FDES}$, such that the first output frequency may quickly frequency lock to a desired value. During the coarse tuning mode, the digital PLL circuit 54 may hold the first digital control signal $D_{CS1}$ constant. During the fine tuning mode, the digital PLL circuit 54 may control the first output frequency by varying the first digital control signal $D_{CS1}$ based on a phase difference associated with the digital phase measurement signal $D_{PMEAS}$ and the digital desired frequency signal $D_{FDES}$. The fine tuning mode may follow the coarse tuning mode and since the first output frequency was frequency locked to a desired value, the first output frequency may quickly phase lock to a desired value. During the fine tuning mode, the digital FLL circuit 66 may hold the second digital control signal $D_{CS2}$ constant.

Alternate embodiments of the present invention may add a fast acquisition mode, which may follow the coarse tuning mode and may precede the fine tuning mode. During the fast acquisition mode, the digital FLL circuit 66 may provide a control signal (not shown) to the digital PLL circuit 54 to vary the first digital control signal $D_{CS1}$ based on a frequency difference associated with the digital phase measurement signal $D_{PMEAS}$ and the digital desired frequency signal $D_{FDES}$, such that the first output frequency may quickly frequency lock to the desired value.

Figure 9:
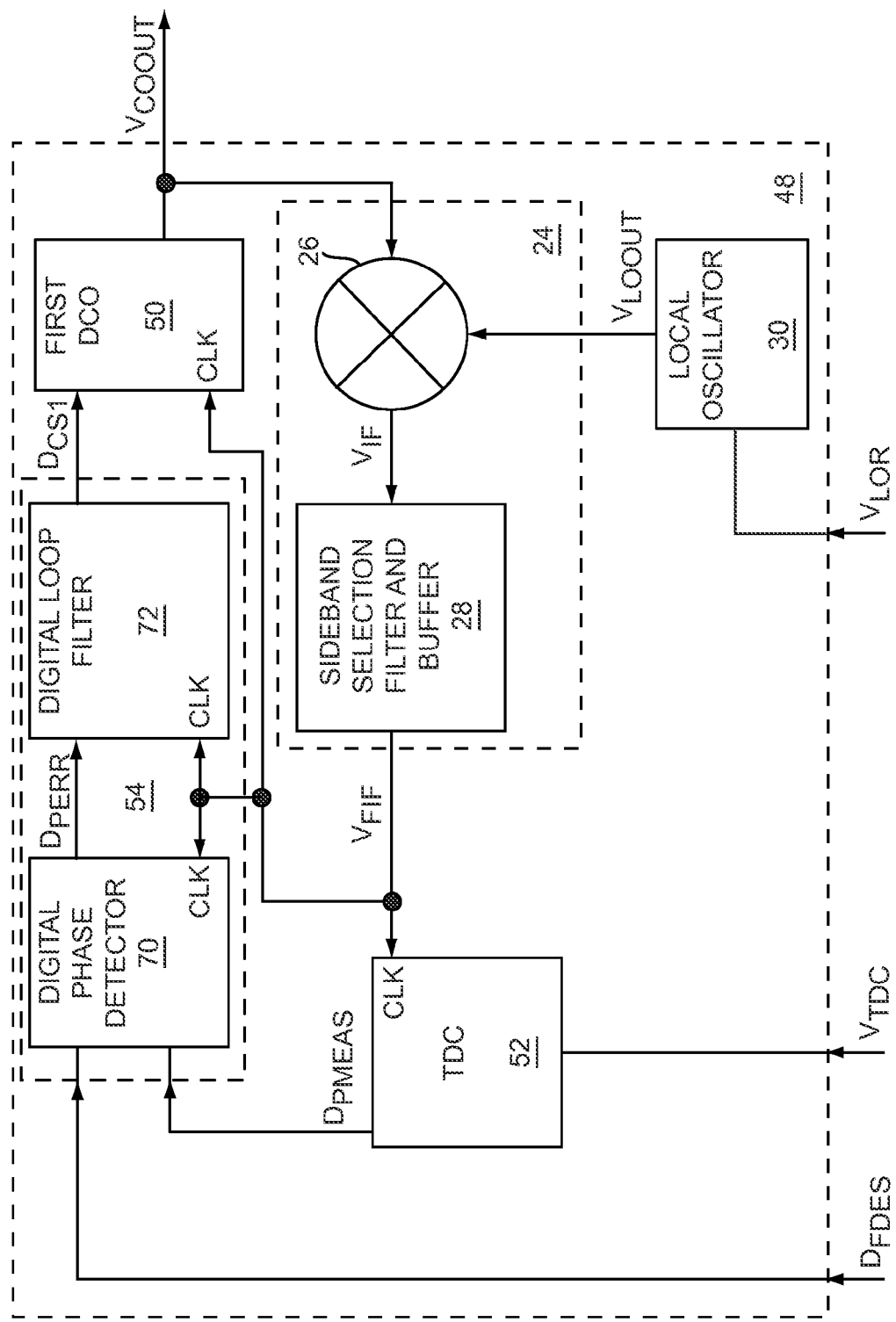
FIG. 9 shows details of a digital PLL circuit illustrated in FIG. 4, according to one embodiment of the digital PLL circuit.

FIG. 9 shows details of the digital PLL circuit 54 illustrated in FIG. 4 according to one embodiment of the digital PLL circuit 54. The digital PLL circuit 54 includes a digital phase detector 70 and a digital loop filter 72. The digital phase detector 70 receives the digital phase measurement signal $D_{PMEAS}$ and the digital desired frequency signal $D_{FDES}$. The digital phase detector 70 provides a digital phase error signal $D_{PERR}$ to the digital loop filter 72 based on a phase difference between the first reference phase and the first output phase. The digital loop filter 72 receives and filters the digital phase error signal $D_{PERR}$ to provide the first digital control signal $D_{CS1}$. The filtered IF signal $V_{FIF}$ may be fed to a clock input CLK of the digital phase detector 70, to a clock input CLK of the digital loop filter 72, or both, and may be used as a sampling clock to synchronize to the digital phase measurement signal $D_{PMEAS}$, to the first digital control signal $D_{CS1}$, to the digital desired frequency signal $D_{FDES}$, to the digital phase error signal $D_{PERR}$, or any combination thereof. In an alternate embodiment of the present invention, the TDC reference signal $V_{TDC}$ may be fed to the clock input CLK of the digital phase detector 70, to the clock input CLK of the digital loop filter 72, to the clock input CLK of the first DCO 50, or any combination thereof, in place of the filtered IF signal $V_{FIF}$. The digital loop filter 72 may be a lowpass filter to remove high frequency components from the digital phase error signal $D_{PERR}$ and may predominantly establish a PLL loop bandwidth for the DOPLL 48.

Figure 10:
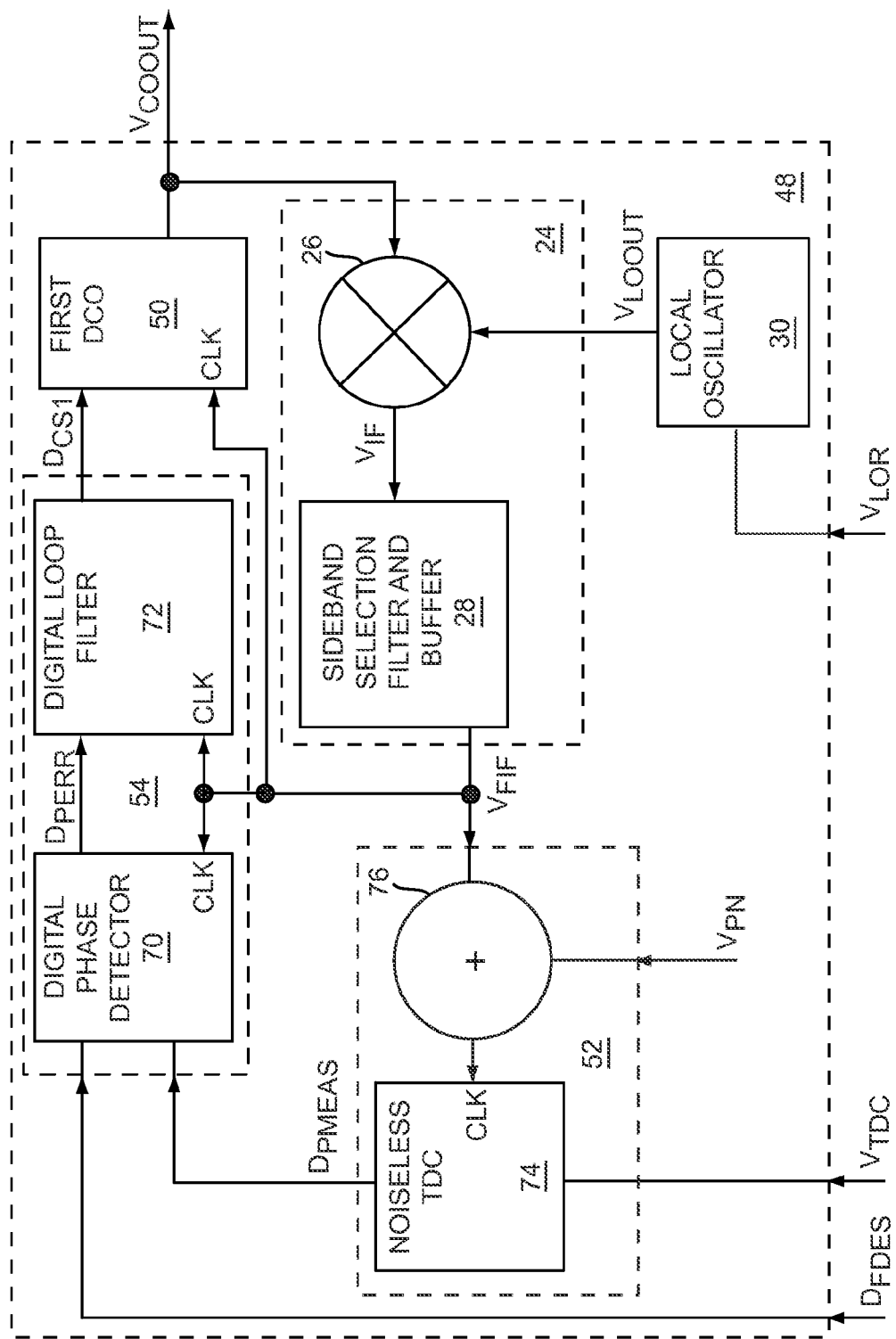
FIG. 10 shows behavioral details of a time-to-digital converter (TDC) illustrated in FIG. 9 for comparison purposes.
Figure 11:
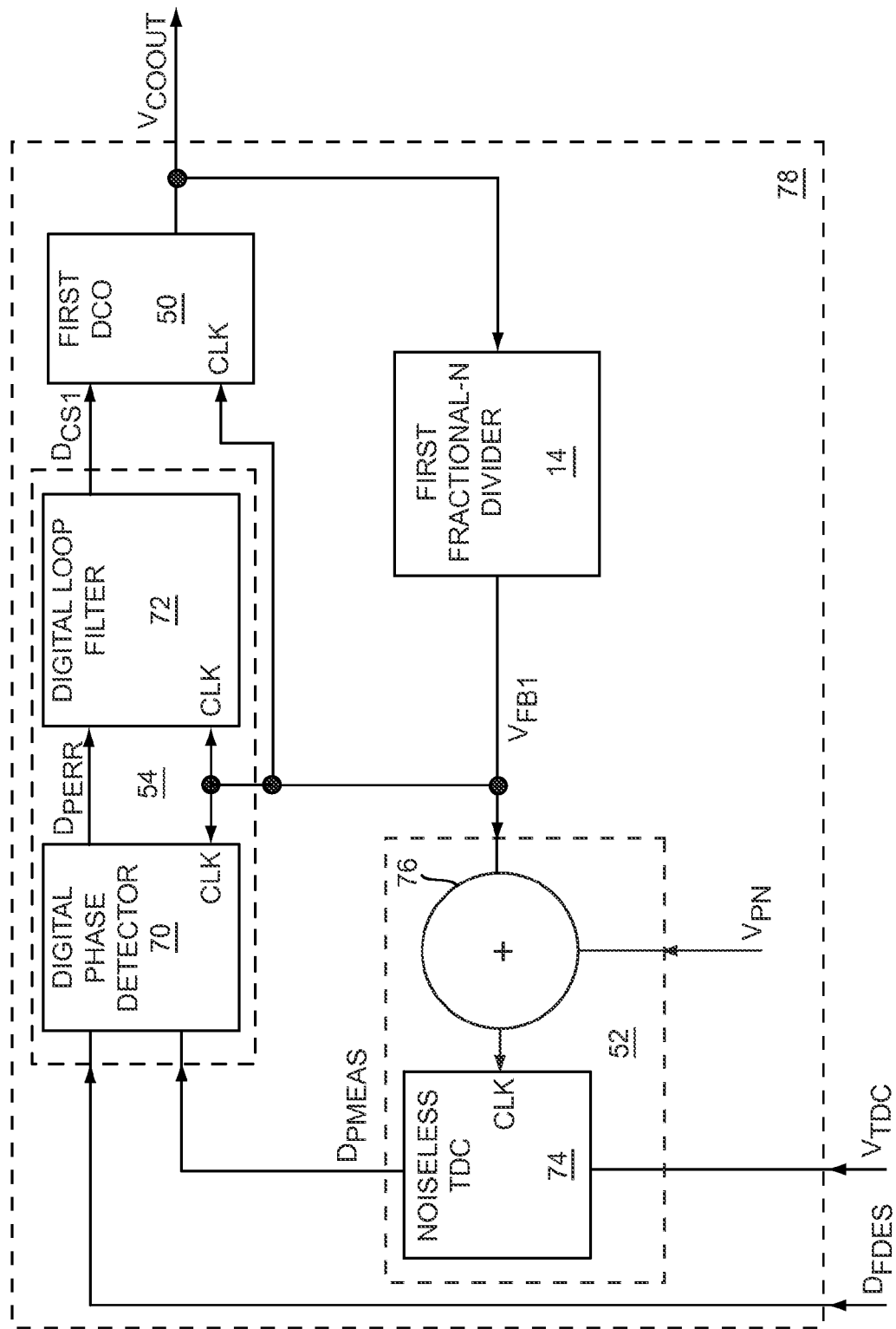
FIG. 11 shows a digital fractional-N PLL (DFNPLL) for comparison purposes.

One significant advantage of an offset PLL compared to a divider based, or single-loop, fractional-N PLL is that in an offset PLL, an absolute time resolution requirement of the TDC 52 may be significantly reduced compared to the absolute time resolution requirement of the TDC 52 in a divider based, or single-loop, fractional-N PLL. FIG. 10 and FIG. 11 are used to present a comparison between an offset PLL and a divider based, or single-loop, fractional-N PLL.

FIG. 10 shows behavioral details of the TDC 52 illustrated in FIG. 9 for comparison purposes. The TDC 52 is modeled by a noiseless TDC 74, a noise summation circuit 76, and a phase noise signal $V_{PN}$, which represents the TDC quantization noise. The noise summation circuit 76 receives and sums the filtered IF signal $V_{FIF}$ and the phase noise signal $V_{PN}$. The noise summation circuit 76 provides a summation signal to a clock input CLK of the noiseless TDC 74. The noiseless TDC 74 behaves as a noiseless version of the TDC 52. The digital desired frequency signal $D_{FDES}$ represents the instantaneous frequency of a reference signal $v_{ref}(t)$ given by EQ. 1, as shown below.

$$v_{ref}(t)=A_{ref}\sin(\omega_{ref}t+\phi_{ref}(t)), \quad \text{EQ. 1}$$

where $A_{ref}$ is the amplitude, $\omega_{ref}$ is the angular frequency, and $\phi_{ref}$ is the phase of the reference signal. The controlled oscillator output signal $V_{COOUT}$ is represented by EQ. 2, as shown below.

$$V_{COOUT}=v_{vco}(t)=A_{vco}\sin(\omega_{vco}t+\phi_{vco}(t)), \quad \text{EQ. 2}$$

where $A_{vco}$ is the amplitude, $\omega_{vco}$ is the angular frequency, and $\phi_{vco}$ is the phase of the controlled oscillator output signal $V_{COOUT}$. The filtered IF signal $V_{FIF}$ is represented by EQ. 3, as shown below.

$$V_{FIF}=v_{if}(t)=A_{if}\sin(\omega_{if}t+\phi_{if}(t)), \quad \text{EQ. 3}$$

where $A_v$ is the amplitude of, $\omega_v$ is the angular frequency, and $\phi_v$ is the phase of the filtered IF signal $V_{FIF}$. When the lower sideband component is selected, the frequency and phase of the filtered IF signal $V_{FIF}$ are equal to the difference of the frequencies and phases, respectively, of the LO signal $V_{LOOUT}$ and the controlled oscillator output signal $V_{COOUT}$ as shown in EQ. 4 below.

$$V_{FIF}=A_v\sin((\omega_{lo}-\omega_{vco})t+\phi_{lo}(t)-\phi_{vco}(t)), \quad \text{EQ. 4}$$

where $\omega_{lo}$ is the angular frequency and $\phi_{lo}$ is the phase of the LO output signal $V_{LOOUT}$. In converting the filtered IF signal $V_{FIF}$ into the digital phase measurement signal $D_{PMEAS}$, the quantization noise of the TDC 52 is added to the filtered IF signal $V_{FIF}$ as shown in EQ. 5 below.

$$\phi_{if\_meas}(t)=\phi_{lo}(t)-\phi_{vco}(t)+\phi_n(t), \quad \text{EQ. 5}$$

where $\phi_{if\_meas}$ is the phase of the digital phase measurement signal $D_{PMEAS}$ and $\phi_n$ is the phase noise added by the phase noise signal $V_{PN}$. The digital phase error signal $D_{PERR}$ is based on a phase difference between the digital desired frequency signal $D_{FDES}$ and the digital phase measurement signal $D_{PMEAS}$, as shown in EQ. 6 below.

$$D_{PERR}=\phi_{err}(t)=\phi_{ref}(t)-\phi_{if\_meas}(t)=\phi_{ref}(t)-\phi_{lo}(t)+\phi_{vco}(t)-\phi_n(t). \quad \text{EQ. 6}$$

Because the DOPLL 48 is a PLL, the loop will drive to make the phase error zero; therefore, EQ. 7 is obtained by equating EQ. 6 to zero and solving for $\phi_{vco}$ as shown below.

$$\phi_{vco}(t)=-\phi_{ref}(t)+\phi_{lo}(t)+\phi_n(t). \quad \text{EQ. 7}$$

Therefore, phase noise of the controlled oscillator output signal $V_{COOUT}$ is based on the combined reference noise, LO phase noise, and the TDC quantization noise.

FIG. 11 shows a digital fractional-N PLL (DFNPLL) 78 for comparison purposes. The DFNPLL 78 illustrated in FIG. 11 is similar to the DOPLL 48 illustrated in FIG. 10, except the RF mixer circuit 24 and the LO 30 illustrated in FIG. 10 are replaced with the first fractional-N divider 14 in FIG. 11. Further, the first fractional-N divider 14 provides the first feedback signal $V_{FB1}$ instead of the filtered IF signal $V_{FIF}$. Therefore, the phase of the digital phase measurement signal $D_{PMEAS}$ is shown in EQ. 8 below.

$$\phi_{v'}(t) = \frac{\phi_{vco}(t)}{N} + \phi_n(t), \quad \text{EQ. 8}$$

where $\phi_{v'}$ is the phase of the digital phase measurement signal $D_{PMEAS}$ and N is the division ratio of the first fractional-N divider 14. The digital phase error signal $D_{PERR}$ is based on a phase difference between the digital desired frequency signal $D_{FDES}$ and the digital phase measurement signal $D_{PMEAS}$, as shown in EQ. 9 below.

$$D_{PERR} = \phi_{err}(t) = \phi_{ref}(t) - \phi_{v'}(t) = \phi_{ref}(t) - \frac{\phi_{vco}(t)}{N} - \phi_n(t). \quad \text{EQ. 9}$$

Because the DFNPLL 78 is a PLL, the loop will drive to make the phase error zero; therefore, EQ. 10 is obtained by equating EQ. 10 to zero and solving for $\phi_{vco}$ as shown below.

$$\phi_{vco}(t)=N[\phi_{ref}(t)-\phi_n(t)]. \quad \text{EQ. 10}$$

Therefore, the phase noise of the controlled oscillator output signal $v_{COOUT}$ is based on the combined reference noise and the TDC quantization noise times the division ratio N of the first fractional-N divider 14. By comparing EQ. 7 to EQ. 10, since N can be an integer of significant magnitude, the phase noise of the controlled oscillator output signal $V_{COOUT}$ associated with the DFNPLL 78 may be significantly greater than the phase noise of the controlled oscillator output signal $V_{COOUT}$ typically associated with the DOPLL 48, thereby making the DOPLL 48 a preferred choice for many applications.

Figure 12:
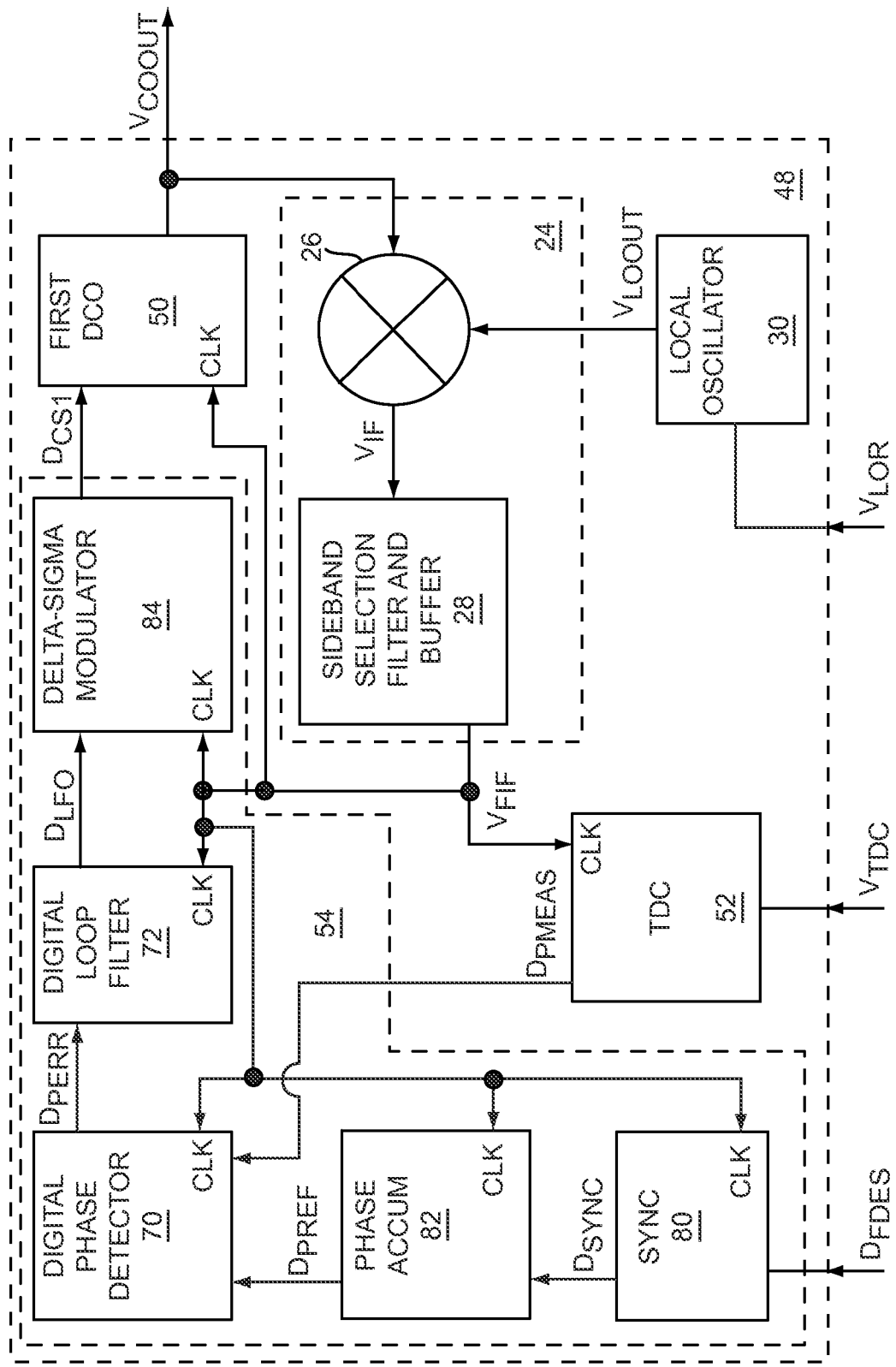
FIG. 12 shows details of the digital PLL circuit illustrated in FIG. 4 according to an alternate embodiment of the digital PLL circuit.

FIG. 12 shows details of the digital PLL circuit 54 illustrated in FIG. 4 according to an alternate embodiment of the digital PLL circuit 54. The digital PLL circuit 54 includes a synchronizer 80, a phase accumulator 82, the digital phase detector 70, the digital loop filter 72, and a delta-sigma modulator 84. The synchronizer 80 receives the filtered IF signal $V_{FIF}$ on a CLK input and the digital desired frequency signal $D_{FDES}$, and provides a digital synchronized signal $D_{SYNC}$ to the phase accumulator 82. The digital synchronized signal $D_{SYNC}$ has same sequence of values as the digital desired frequency signal $D_{FDES}$ but has updates synchronized in time to the filtered IF signal $V_{FIF}$.

The phase accumulator 82 is a digital integrator that receives and integrates the digital synchronized signal $D_{SYNC}$ to provide a digital phase reference signal $D_{PREF}$ to the digital phase detector 70. The filtered IF signal $V_{FIF}$ may be fed to a clock input CLK of the phase accumulator 82 to synchronize to the digital synchronized signal $D_{SYNC}$ and to the digital phase reference signal $D_{PREF}$.

The digital phase detector 70 receives the digital phase measurement signal $D_{PMEAS}$ and the digital phase reference signal $D_{PREF}$. The digital phase detector 70 provides the digital phase error signal $D_{PERR}$ to the digital loop filter 72 based on a phase difference between the first reference phase and the first output phase. The digital loop filter 72 receives and filters the digital phase error signal $D_{PERR}$ to provide a digital loop filter output signal $D_{LFO}$ to the delta-sigma modulator 84. The filtered IF signal $V_{FIF}$ may be fed to a clock input CLK of the digital phase detector 70, to a clock input CLK of the digital loop filter 72, or both, and may be used as a sampling clock to synchronize to the digital phase measurement signal $D_{PMEAS}$, to the digital phase reference signal $D_{PREF}$, to the digital phase error signal $D_{PERR}$, to the digital loop filter output signal $D_{LFO}$, or any combination thereof. The digital loop filter 72 may be a lowpass filter to remove high frequency components from the digital phase error signal $D_{PERR}$ and may predominantly establish a PLL loop bandwidth for the DOPLL 48.

The delta-sigma modulator 84 modulates the digital loop filter output signal $D_{LFO}$ to provide the first digital control signal $D_{CS1}$. The modulation may be used to interpolate between discrete values in the digital loop filter output signal $D_{LFO}$ to match a resolution of the digital loop filter output signal $D_{LFO}$ to a resolution of the first digital control signal $D_{CS1}$. The filtered IF signal $V_{FIF}$ may be fed to a clock input CLK of the delta-sigma modulator 84 to synchronize to the digital loop filter output signal $D_{LFO}$, to the first digital control signal $D_{CS1}$, or both. The digital synchronized signal $D_{SYNC}$ may include any number of bits. The digital phase reference signal $D_{PREF}$ may include any number of bits. The digital phase error signal $D_{PERR}$ may include any number of bits. The digital loop filter output signal $D_{LFO}$ may include any number of bits.

An additional benefit of the present invention is that it allows known spurious tones (or "spurs") to be systematically avoided or eliminated with a method similar to that disclosed by Scott R. Humphreys et al. in U.S. Pat. No. 7,098,754. In any RF system spurs may occur at a frequency $f_{spur}$ given by:

$$f_{spur} = (m \cdot f_1 + n \cdot f_2),$$

where f1 and f2 are fundamental signal frequencies such as a reference frequency of the system, a frequency of an oscillator within the system, or other external interfering sources, and m and n are positive or negative integers. These spurs become problematic if they occur close to a frequency of a signal used in a communication system such that transmit spectral mask requirements or receive blocking spectral requirements are not met. One type of problematic spur may occur at the controlled oscillator output signal $V_{COOUT}$ when the frequency of the DCO 50 is close to an integer multiple (or harmonic) of the filtered IF signal $V_{FIF}$. This type of spur may be avoided by selecting the IF frequency to be equal to an integer division of the frequency of the controlled oscillator output signal $V_{COOUT}$. Generally, there is more than one IF frequency that satisfies this condition. A second type of problematic spur may occur when the frequency of the LO 30 is close to a harmonic of a reference signal such as the LO reference signal $V_{LOREF}$ or the TDC reference signal $V_{TDC}$. This spur may be translated by the RF mixer 26 to the filtered IF signal $V_{FIF}$ and may subsequently affect the first control signal $V_{CS1}$, such that the spur may appear in the controlled oscillator output signal $V_{COOUT}$. This second type of spur may be avoided by selecting the IF frequency that provides the maximum distance between the frequency of the LO 30 and the closest harmonic of the LO reference signal $V_{LOREF}$, or the TDC reference signal $V_{TDC}$ to the frequency of the LO 30.

Figure 13:
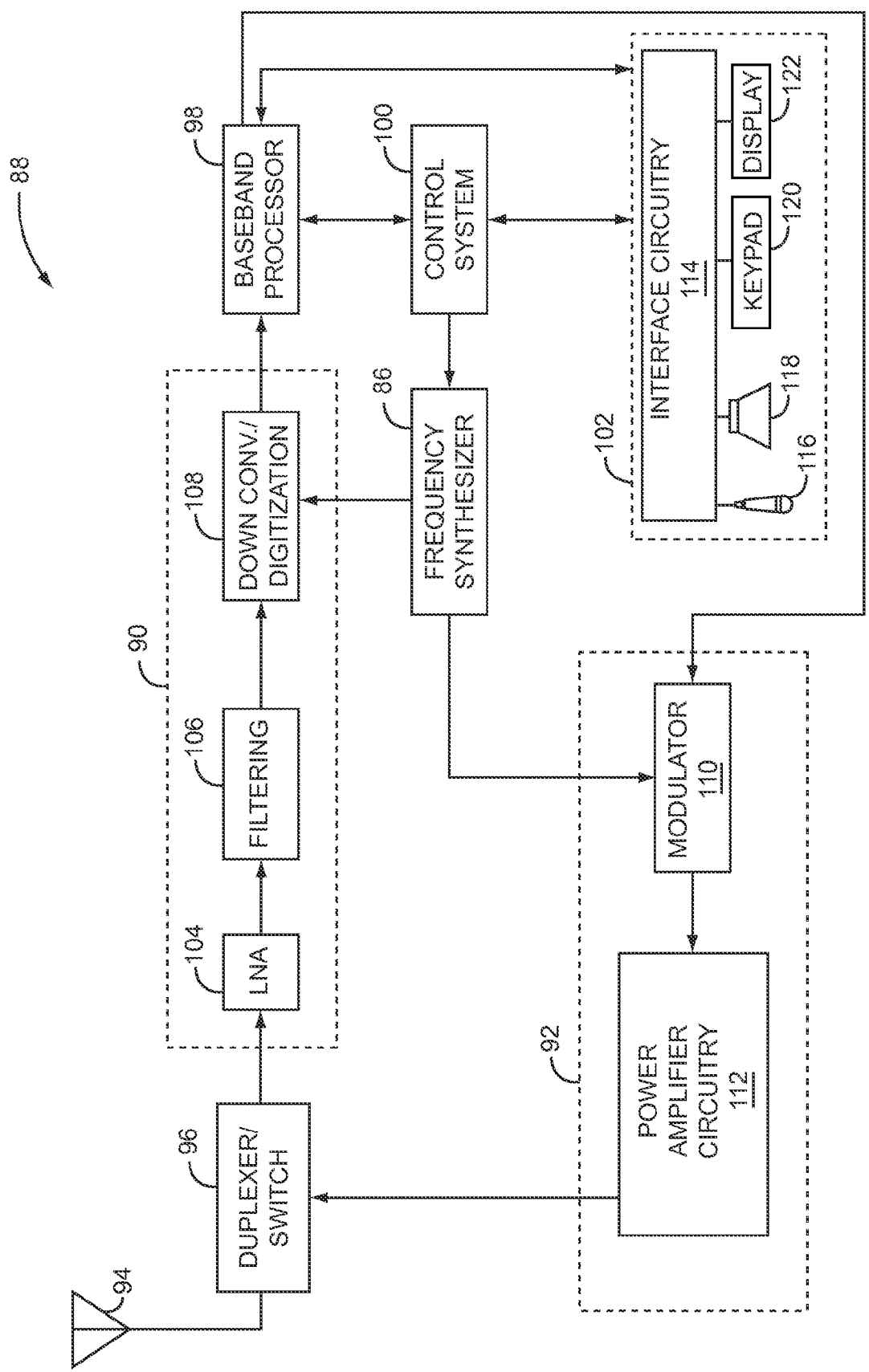
FIG. 13 shows a first exemplary embodiment of the present invention used in a mobile terminal.

A first exemplary embodiment of a DOPLL 48 is its use in a frequency synthesizer 86 in a mobile terminal 88, the basic architecture of which is represented in FIG. 13. The mobile terminal 88 may include a receiver front end 90, a radio frequency transmitter section 92, an antenna 94, a duplexer or switch 96, a baseband processor 98, a control system 100, the frequency synthesizer 86, and an interface 102. The receiver front end 90 receives information bearing radio frequency signals from one or more remote transmitters provided by a base station (not shown). A low noise amplifier (LNA) 104 amplifies the signal. Filtering 106 minimizes broadband interference in the received signal, while down conversion and digitization circuitry 108 down converts the filtered, received signal to an intermediate or baseband frequency signal, which is then digitized into one or more digital streams. The receiver front end 90 typically uses one or more mixing frequencies generated by the frequency synthesizer 86. The baseband processor 98 processes the digitized received signal to extract the information or data bits conveyed in the received signal. This processing typically comprises demodulation, decoding, and error correction operations. As such, the baseband processor 98 is generally implemented in one or more digital signal processors (DSPs).

On the transmit side, the baseband processor 98 receives digitized data, which may represent voice, data, or control information, from the control system 100, which it encodes for transmission. The encoded data is output to the radio frequency transmitter section 92, where it is used by a modulator 110 to modulate a carrier signal that is at a desired transmit frequency. Power amplifier circuitry 112 amplifies the modulated carrier signal to a level appropriate for transmission, and delivers the amplified and modulated carrier signal to the antenna 94 through the duplexer or switch 96.

A user may interact with the mobile terminal 88 via the interface 102, which may include interface circuitry 114 associated with a microphone 116, a speaker 118, a keypad 120, and a display 122. The interface circuitry 114 typically includes analog-to-digital converters, digital-to-analog converters, amplifiers, and the like. Additionally, it may include a voice encoder/decoder, in which case it may communicate directly with the baseband processor 98. The microphone 116 will typically convert audio input, such as the user's voice, into an electrical signal, which is then digitized and passed directly or indirectly to the baseband processor 98. Audio information encoded in the received signal is recovered by the baseband processor 98, and converted by the interface circuitry 114 into an analog signal suitable for driving the speaker 118. The keypad 120 and the display 122 enable the user to interact with the mobile terminal 88, input numbers to be dialed, address book information, or the like, as well as monitor call progress information.

Figure 14:
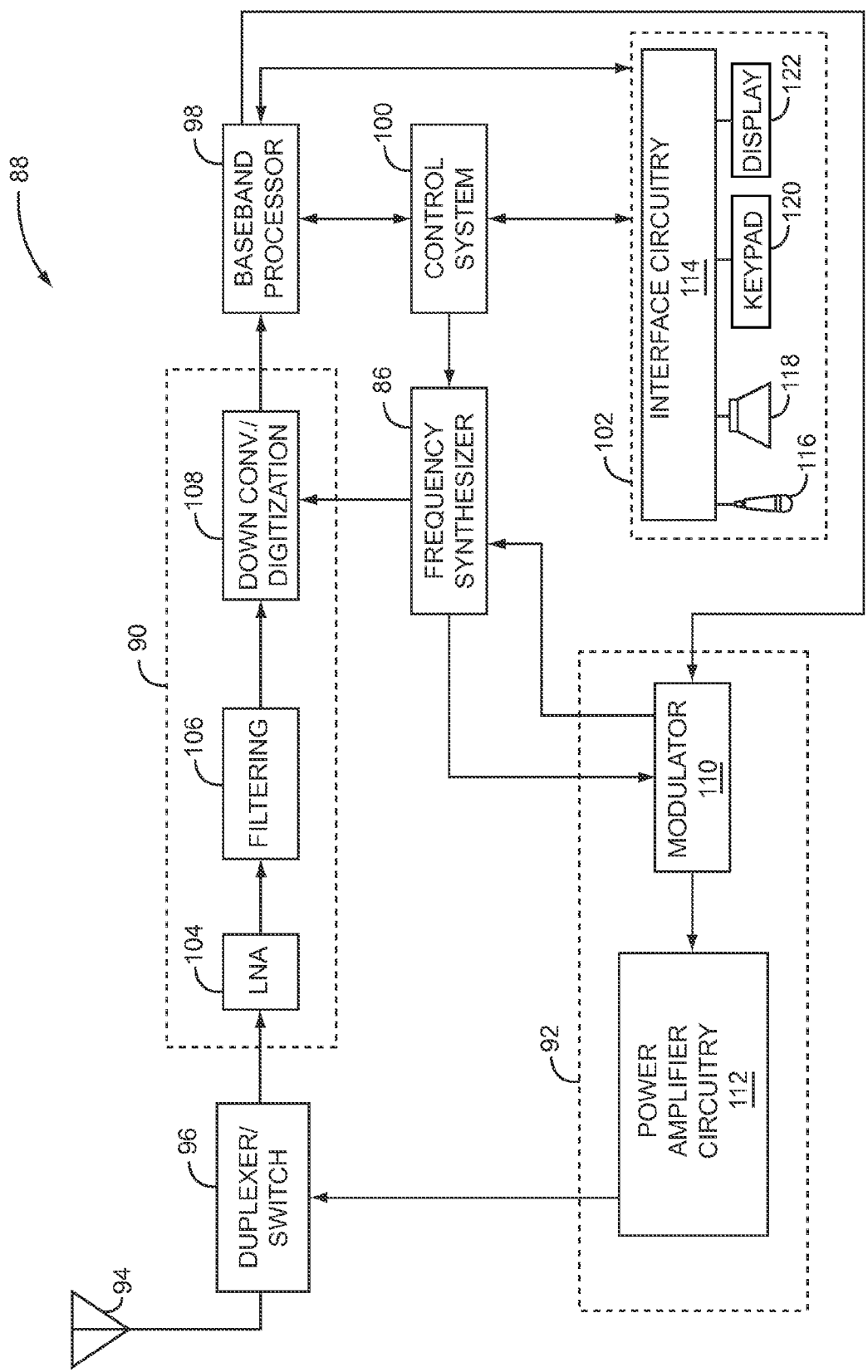
FIG. 14 shows a second exemplary embodiment of the present invention used in a mobile terminal.

A second exemplary embodiment of the DOPLL 48 is shown in FIG. 14. The mobile terminal 88 illustrated in FIG. 14 is similar to the mobile terminal 88 illustrated in FIG. 13, except the modulator 110 illustrated in FIG. 13 provides phase modulation, frequency modulation, or both, to the DOPLL 48 (not shown) in the frequency synthesizer 86, which provides a modulated carrier signal to the modulator 110. The modulator 110 may or may not amplitude modulate the modulated carrier signal before forwarding the modulated carrier signal to the power amplifier circuitry 112.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) circuit comprising:
   a first digital controlled oscillator (DCO) adapted to:
      receive a first digital control signal; and
      provide an RF output signal having a first frequency and a first phase, such that the first frequency is based on the first digital control signal;
   a first RF mixer circuit adapted to:
      receive a first local oscillator (LO) signal and the RF output signal; and
      provide a first intermediate frequency (IF) signal based on mixing the first LO signal and the RF output signal;
   a time-to-digital converter adapted to:
      receive and convert the first IF signal into a digital time representation of the first IF signal; and
      provide a first digital signal based on the digital time representation, such that the first digital signal is indicative of the first phase and the first frequency; and
   digital loop circuitry adapted to:
      receive a digital setpoint signal;
      receive the first digital signal; and
      provide the first digital control signal based on a difference between the digital setpoint signal and the first digital signal,
   wherein the first frequency is controlled to be about equal to a desired frequency represented by the digital setpoint signal.

2. The RF circuit of claim 1 wherein:
   the first LO signal has a first LO frequency and a first LO phase;
   the first IF signal has a first IF frequency and a first IF phase;
   the first IF frequency is based on a difference between the first LO frequency and the first frequency;
   the first IF phase is based on the first LO phase and the first phase; and
   the first digital signal is further based on the first IF phase.

3. The RF circuit of claim 2 wherein the first RF mixer circuit comprises:
   an RF mixer adapted to:
      receive the first LO signal and the RF output signal; and
      mix the first LO signal and the RF output signal to provide a second IF signal, which has an upper sideband component and a lower sideband component; and
   a sideband selection filter adapted to:
      receive the second IF signal; and
      filter the second IF signal to remove the upper sideband component and provide the first IF signal.

4. The RF circuit of claim 2 wherein the first IF frequency is chosen to be about equal to the first frequency divided by an integer.

5. The RF circuit of claim 2 wherein the first IF frequency is chosen, such that there is at least a minimum offset between one or more frequencies of spurs appearing in the first LO signal and the first LO frequency.

6. The RF circuit of claim 1 wherein:
   the digital loop circuitry comprises:
      control circuitry adapted to select between a coarse tuning mode and a fine tuning mode;
      a digital phase-locked loop (PLL) circuit, which during the fine tuning mode is adapted to:
         receive the digital setpoint signal, which has a first reference phase;
         receive the first digital signal;
         provide a first digital phase error signal based on a first phase difference between the first reference phase and the first phase; and
         filter the first digital phase error signal to provide the first digital control signal; and
      a digital frequency-locked loop (FLL) circuit, which during the coarse tuning mode is adapted to:
         receive the digital setpoint signal, which has a first reference frequency;
         receive the first digital signal;
         provide a first digital frequency error signal based on a difference associated with the first reference frequency and the first frequency; and
         filter the first digital frequency error signal to provide a second digital control signal; and
   the first DCO is further adapted to receive the second digital control signal, and the first frequency is further based on the second digital control signal.

7. The RF circuit of claim 6 wherein the first DCO comprises:
   a switched capacitor bank having a plurality of capacitors and adapted to:
      receive the second digital control signal; and
      select at least one of the plurality of capacitors based on the second digital control signal;
   a digital-to-analog converter (DAC) adapted to:
      receive the first digital control signal; and
      provide an analog control signal based on the first digital control signal; and
   a voltage controlled oscillator (VCO) adapted to:
      receive the analog control signal; and
      provide the RF output signal based on the analog control signal and the selection of the at least one of the plurality of capacitors.

8. The RF circuit of claim 1 wherein the digital loop circuitry comprises a digital phase-locked loop (PLL) circuit adapted to:
   receive the digital setpoint signal, which has a first reference phase;
   receive the first digital signal;
   provide a first digital phase error signal based on a first phase difference between the first reference phase and the first phase; and
   filter the first digital phase error signal to provide the first digital control signal.

9. The RF circuit of claim 8 wherein the first DCO comprises a switched capacitor bank having a plurality of capacitors and adapted to:
   receive the first digital control signal; and
   select at least one of the plurality of capacitors based on the first digital control signal,
wherein the RF output signal is based on the selection of the at least one of the plurality of capacitors.

10. The RF circuit of claim 8 wherein the first DCO comprises:
   a digital-to-analog converter (DAC) adapted to:
      receive the first digital control signal; and
      provide an analog control signal based on the first digital control signal; and
   a voltage controlled oscillator (VCO) adapted to:
      receive the analog control signal; and
      provide the RF output signal based on the analog control signal.

11. The RF circuit of claim 8 wherein:
   the digital PLL circuit is further adapted to filter the first digital phase error signal to further provide a second digital control signal, such that the second digital control signal has bits of a higher significance than the first digital control signal; and
   the first DCO is further adapted to receive the second digital control signal, and the first frequency is further based on the second digital control signal.

12. The RF circuit of claim 11 wherein the first DCO comprises:
   a switched capacitor bank having a plurality of capacitors and adapted to:
      receive the second digital control signal; and
      select at least one of the plurality of capacitors based on the second digital control signal;
   a digital-to-analog converter (DAC) adapted to:
      receive the first digital control signal; and
      provide an analog control signal based on the first digital control signal; and
   a voltage controlled oscillator (VCO) adapted to:
      receive the analog control signal; and
      provide the RF output signal based on the analog control signal and the selection of the at least one of the plurality of capacitors.

13. The RF circuit of claim 8 wherein the time-to-digital converter is further adapted to:
   receive a first reference signal; and
   convert the first IF signal into the first digital signal using the first reference signal,
wherein the first IF signal is continuous time valued and the first digital signal is discrete time valued.

14. The RF circuit of claim 13 wherein the first reference signal is sampled using the first IF signal as a sampling clock.

15. The RF circuit of claim 13 further comprising an LO adapted to:
   receive the first reference signal; and
   provide the first LO signal based on the first reference signal.

16. The RF circuit of claim 8 further comprising an LO adapted to:
   receive a first reference signal; and
   provide the first LO signal based on the first reference signal.

17. The RF circuit of claim 16 wherein the RF circuit is a dual loop PLL, such that the first DCO, the first RF mixer circuit, the time-to-digital converter, and the digital loop circuitry form a first PLL loop, and the LO provides a second PLL loop.

18. The RF circuit of claim 16 wherein the first LO signal has an LO frequency, which is chosen to avoid an RF spur on the RF output signal.

19. The RF circuit of claim 8 wherein:
   the first DCO, the first RF mixer circuit, the time-to-digital converter, and the digital loop circuitry form a PLL loop having a PLL loop bandwidth;
   the digital setpoint signal is modulated to frequency modulate the RF output signal; and
   the RF output signal has a modulation bandwidth.

20. The RF circuit of claim 19 wherein the modulation bandwidth is about less than the PLL loop bandwidth.

21. The RF circuit of claim 8 wherein:
   the first DCO, the first RF mixer circuit, the time-to-digital converter, and the digital loop circuitry forms a PLL loop having a PLL loop bandwidth;
   the digital setpoint signal is modulated to phase modulate the RF output signal; and
   the RF output signal has a modulation bandwidth, which is about less than the PLL loop bandwidth.

22. The RF circuit of claim 8 wherein the digital PLL circuit comprises:
   a digital phase detector adapted to:
      receive the digital setpoint signal;
      receive the first digital signal; and
      provide the first digital phase error signal based on the first phase difference between the first reference phase and the first phase; and
   a digital loop filter adapted to:
      receive the first digital phase error signal; and
      filter the first digital phase error signal to provide the first digital control signal.

23. The RF circuit of claim 22 wherein:
   the digital phase detector is further adapted to:
      receive the first IF signal;
      sample the digital setpoint signal using the first IF signal as a sampling clock;
      sample the first digital signal using the first IF signal as a sampling clock; and
      provide the first digital phase error signal based on the sampled digital setpoint signal and the sampled first digital signal; and
   the digital loop filter is further adapted to:
      receive the first IF signal;
      sample the first digital phase error signal using the first IF signal as a sampling clock; and
      filter the sampled first digital phase error signal to provide the first digital control signal.

24. The RF circuit of claim 22 wherein:
the digital phase detector is further adapted to:
  receive a first reference signal;
  sample the digital setpoint signal using the first reference signal as a sampling clock;
  sample the first digital signal using the first reference signal as a sampling clock; and
  provide the first digital phase error signal based on the sampled digital setpoint signal and the sampled first digital signal; and
the digital loop filter is further adapted to:
  receive the first reference signal;
  sample the first digital phase error signal using the first reference signal as a sampling clock; and
  filter the sampled first digital phase error signal to provide the first digital control signal.

25. The RF circuit of claim 8 wherein the digital PLL circuit comprises:
a synchronizer adapted to:
  receive the first IF signal;
  receive the digital setpoint signal; and
  synchronize the digital setpoint signal using the first IF signal as a sampling clock to provide a synchronized digital setpoint signal;
a phase accumulator adapted to:
  receive the first IF signal;
  receive the synchronized digital setpoint signal;
  sample the synchronized digital setpoint signal using the first IF signal as a sampling clock;
  accumulate phase of the sampled synchronized digital setpoint signal; and
  provide an accumulated phase signal based on the accumulated phase of the sampled synchronized digital setpoint signal;
a digital phase detector adapted to:
  receive the first IF signal;
  receive the accumulated phase signal;
  sample the accumulated phase signal using the first IF signal as a sampling clock;
  receive the first digital signal;
  sample the first digital signal using the first IF signal as a sampling clock; and
  provide the first digital phase error signal based on the sampled accumulated phase signal and the sampled first digital signal; and
a digital loop filter adapted to:
  receive the first IF signal;
  sample the first digital phase error signal using the first IF signal as a sampling clock; and
  filter the sampled first digital phase error signal to provide the first digital control signal.

26. The RF circuit of claim 8 wherein the digital PLL circuit comprises:
a digital phase detector adapted to:
  receive the first IF signal;
  receive the digital setpoint signal;
  sample the digital setpoint signal using the first IF signal as a sampling clock;
  receive the first digital signal;
  sample the first digital signal using the first IF signal as a sampling clock; and
  provide the first digital phase error signal based on the sampled digital setpoint signal and the sampled first digital signal;
a digital loop filter adapted to:
  receive the first IF signal;
  sample the first digital phase error signal using the first IF signal as a sampling clock; and
  filter the sampled first digital phase error signal to provide a loop filter output signal; and
a delta-sigma modulator adapted to:
  receive the first IF signal;
  receive the loop filter output signal;
  sample the loop filter output signal using the first IF signal as a sampling clock; and
  modulate the sampled loop filter output signal to provide the first digital control signal.

27. The RF circuit of claim 8 wherein the digital PLL circuit comprises:
a synchronizer adapted to:
  receive the first IF signal;
  receive the digital setpoint signal; and
  synchronize the digital setpoint signal using the first IF signal as a sampling clock to provide a synchronized digital setpoint signal;
a phase accumulator adapted to:
  receive the first IF signal;
  receive the synchronized digital setpoint signal;
  sample the synchronized digital setpoint signal using the first IF signal as a sampling clock;
  accumulate phase of the sampled synchronized digital setpoint signal; and
  provide an accumulated phase signal based on the accumulated phase of the sampled synchronized digital setpoint signal;
a digital phase detector adapted to:
  receive the first IF signal;
  receive the accumulated phase signal;
  sample the accumulated phase signal using the first IF signal as a sampling clock;
  receive the first digital signal;
  sample the first digital signal using the first IF signal as a sampling clock; and
  provide the first digital phase error signal based on the sampled accumulated phase signal and the sampled first digital signal;
a digital loop filter adapted to:
  receive the first IF signal;
  sample the first digital phase error signal using the first IF signal as a sampling clock; and
  filter the sampled first digital phase error signal to provide a loop filter output signal; and
a delta-sigma modulator adapted to:
  receive the first IF signal;
  receive the loop filter output signal;
  sample the loop filter output signal using the first IF signal as a sampling clock; and
  modulate the sampled loop filter output signal to provide the first digital control signal.

28. The RF circuit of claim 1 wherein the digital loop circuitry comprises:
control circuitry adapted to select a coarse tuning mode; and
a digital frequency-locked loop (FLL) circuit, which during the coarse tuning mode is adapted to:
  receive the digital setpoint signal, which has a first reference frequency;
  receive the first digital signal;
  provide a first digital frequency error signal based on a difference associated with the first reference frequency and the first frequency; and
  filter the first digital frequency error signal to provide the first digital control signal.

29. A method comprising:

providing a first digital controlled oscillator (DCO), a first radio frequency (RF) mixer circuit, and a time-to-digital converter;

receiving a first digital control signal;

providing an RF output signal having a first frequency and a first phase, such that the first frequency is based on the first digital control signal;

receiving a first local oscillator (LO) signal and the RF output signal;

mixing the first LO signal and the RF output signal to provide a first intermediate frequency (IF) signal;

receiving and converting the first IF signal into a digital time representation of the first IF signal;

providing a first digital signal based on the digital time representation, such that the first digital signal is indicative of the first phase and the first frequency;

receiving a digital setpoint signal; and providing the first digital control signal based on a difference between the digital setpoint signal and the first digital signal, wherein the first frequency is controlled to be about equal to a desired frequency represented by the digital setpoint signal.

* * * * *